United States Patent
Hori et al.

(12) 
(10) Patent No.: US 6,547,922 B2
(45) Date of Patent: Apr. 15, 2003

(54) VACUUM-PROCESSING APPARATUS USING A MOVABLE COOLING PLATE DURING PROCESSING

(75) Inventors: Tadashi Hori, Nara-ken (JP); Masahiro Kanai, Tokyo (JP); Koichiro Moriyama, Kyoto (JP); Hiroshi Shimoda, Nara (JP); Hiroyuki Ozaki, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 157 days.

(21) Appl. No.: 09/772,987

(22) Filed: Jan. 31, 2001

(65) Prior Publication Data

US 2002/0005171 A1 Jan. 17, 2002

(30) Foreign Application Priority Data

Jan. 31, 2000 (JP) .......................................... 2000-023082

(51) Int. Cl.[7] .......................... H01L 21/00; C23C 16/00
(52) U.S. Cl. .................. 156/345.37; 118/724; 118/718
(58) Field of Search ........................ 156/345.37, 345.31, 156/345.2; 118/718, 724; 438/715, 716, 710

(56) References Cited

U.S. PATENT DOCUMENTS

| 4,400,409 | A |   | 8/1983  | Izu et al. ........................ 427/39 |
|-----------|---|---|---------|-------------------------------------------|
| 5,116,562 | A | * | 5/1992  | Lang ........................... 264/132   |
| 5,411,076 | A | * | 5/1995  | Matsunaga et al. ......... 165/80.2        |
| 5,470,397 | A | * | 11/1995 | Foote et al. ................. 136/260     |
| 5,778,968 | A | * | 7/1998  | Hendrickson et al. ...... 165/80.1         |
| 5,927,994 | A | * | 7/1999  | Kohda et al. ................ 438/478      |
| 5,976,257 | A |   | 11/1999 | Kanai et al. ................ 118/718      |
| 6,086,362 | A | * | 7/2000  | White et al. ................. 432/243     |
| 6,097,005 | A | * | 8/2000  | Akimoto ................... 219/444.1      |
| 6,113,732 | A |   | 9/2000  | Yoshida et al. ............. 156/345       |
| 6,159,300 | A |   | 12/2000 | Hori et al. .................. 118/718     |
| 6,302,966 | B1 | * | 10/2001 | Bailey et al. ................ 118/724    |

* cited by examiner

*Primary Examiner*—Gregory Mills
*Assistant Examiner*—Michelle Crowell
(74) *Attorney, Agent, or Firm*—Fitzpatrick, Cella, Harper & Scinto

(57) ABSTRACT

A vacuum-processing apparatus comprising a vacuum vessel, a processing chamber arranged in the vacuum vessel and a heater for heating a circumferential wall of the processing chamber, wherein a substrate is arranged in the processing chamber and the substrate is vacuum-processed in the processing chamber, characterized in that the vacuum-processing apparatus has a cooling plate arranged at a position to oppose the circumferential wall of the processing chamber for cooling the circumferential wall of the processing chamber, and a mechanism for moving the cooling plate so as to change a distance between the cooling plate and the circumferential wall of the processing chamber.

9 Claims, 4 Drawing Sheets

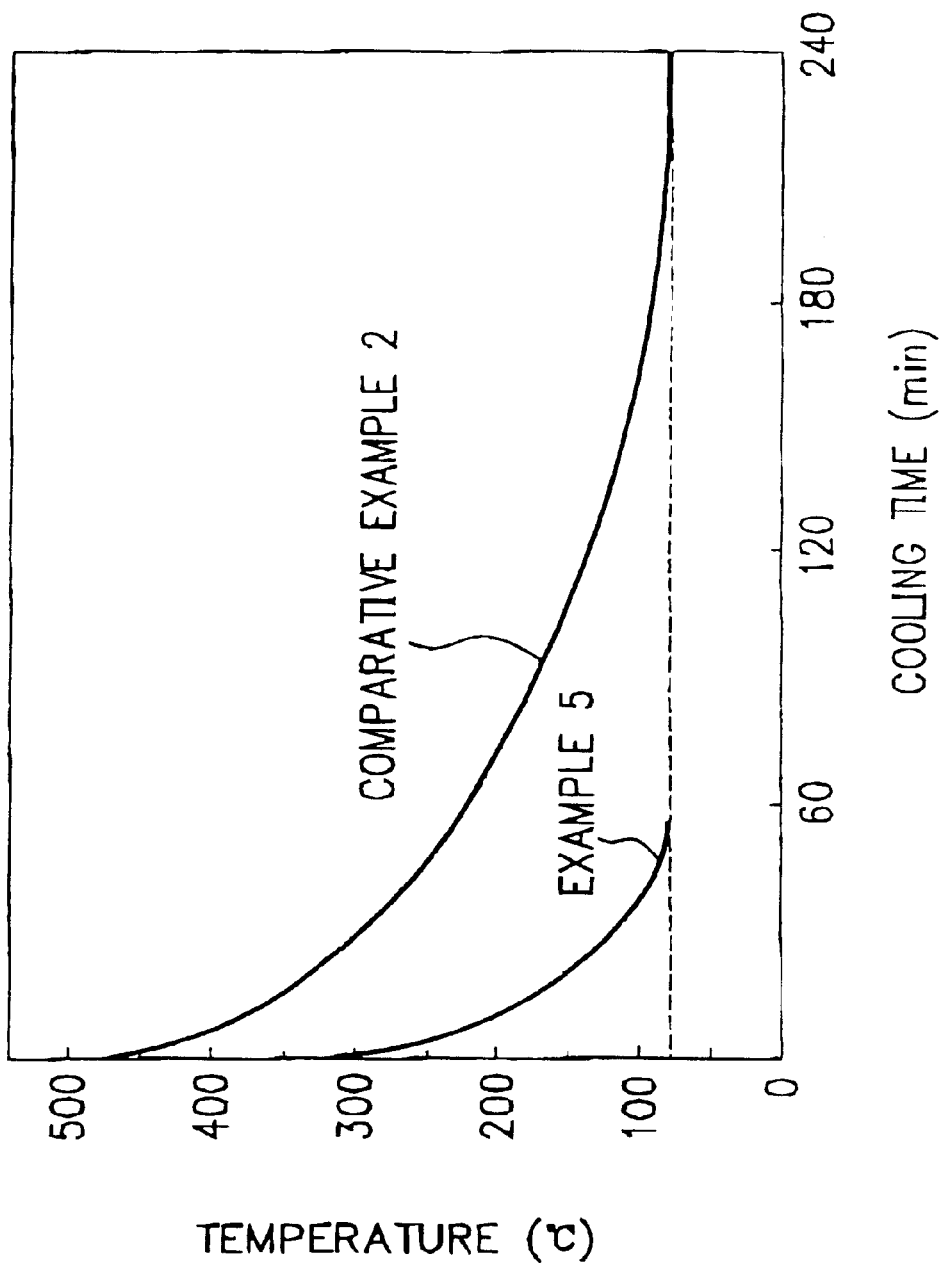

VACUUM-PROCESSING APPARATUS USING A MOVABLE COOLING PLATE DURING PROCESSING

BACKGROUND OF THE INVENTION

1. Field of the Invention

The present invention relates to a vacuum-processing apparatus and method for vacuum-processing an object, including forming a deposited film on a substrate under reduced pressure condition and etching a substrate under reduced pressure condition. Specifically, for instance, the present invention relates to a vacuum-processing apparatus and method which are used in mass-producing a photoelectric conversion element in which a non-single crystal semiconductor material such as an amorphous silicon semiconductor material or the like is used.

2. Related Background Art

There are known a number of elements having a structure comprising a plurality of semiconductor layers composed of a non-single crystal material such as an amorphous material stacked as photoelectric conversion elements which are used in solar cells or the like. In the production of such element, vacuum-processing apparatus capable of forming a thin semiconductor film have been widely used on an industrial scale.

Now, it is basically important for a solar cell that it has a sufficiently high photoelectric conversion efficiency, excels in stability of characteristics, and is able to mass-produce. In view of this, in the production of a solar cell in which a non-single crystal semiconductor layer such as an amorphous semiconductor layer or the like is used, it is necessary that said solar cell is produced so as to have good electric, optical and photoconductive characteristics, physical properties, fatigue resistance upon repeated use, and durability to use environments. And in order to mass-produce such solar cell, it is necessary to adopt a method which makes it possible to repeatedly form a large area semiconductor layer having a uniform thickness and a homogenous property at a high speed to form a photoelectric conversion element which constitutes said solar cell, where said photoelectric conversion element can be mass-produced.

Separately, in a solar cell power generation apparatus (a sunlight power generation apparatus) in which solar cells are used, there is frequently adopted a form in which a plurality of unit solar modules are electrically connected in series connection or parallel connection into an integrated body which outputs a desired electric current and a desired voltage. In this case, it is required that neither disconnection nor short circuit are occurred in each unit solar cell module. In addition, it is important to make such that the solar cell modules are not varied with respect their output electric currents and output voltages. In this connection, at least at a stage of preparing said plurality of unit solar cell modules, it is important that a semiconductor layer constituting each unit solar cell module which is an utmost decisive factor to determine the characteristic of said solar cell module is formed to have an uniform property. By forming a semiconductor having an uniform property for each unit solar cell module in this way, to work out a design for each unit solar cell module can be facilitated and a process of assembling a plurality of unit solar cell modules can be simplified. This situation makes it possible to mass-produce a solar cell power generation apparatus at a reasonable production cost. Thus, there is a demand for provide a film-forming method which enables one to continuously form a semiconductor layer having a uniform property over a large area.

Incidentally, in a solar cell used in a solar cell module, a semiconductor layer which is an important constituent component of said solar cell has a semiconductor junction such as a p-n junction or a p-i-n junction. In the case where the semiconductor layer is constituted by an amorphous silicon (a-Si) semiconductor material, it is known that such semiconductor layer can be formed by a plasma CVD method in that a step of generating plasma discharge in the presence a raw material gas comprising silane gas ($SiH_4$) which, if necessary, contains a doping gas comprising, for instance, phosphine ($PH_3$) or diborane ($B_2H_6$) to decompose said raw material gas whereby forming a semiconductor layer having a desired conduction type on a desired substrate maintained at a desired temperature is repeated to sequentially form a plurality of semiconductor layers having a desired conduction type on said substrate whereby forming a layered semiconductor layer having a desired semiconductor junction on said substrate.

In order to industrially produce a solar cell which can be obtained by stacking a plurality of such amorphous semiconductor layers having a desired conduction type in such manner as above described, there is known a method using a film-forming apparatus having a plurality of independent deposition chambers communicated with each other, in that an elongated substrate is continuously moved to sequentially pass through said plurality of deposition chambers while forming a semiconductor layer having a desired conduction type on said substrate by each deposition chamber to continuously form a stacked body comprising a plurality of semiconductor layers having a desired conduction type and which has a desired semiconductor junction on said substrate.

For instance, U.S. Pat. No 4,400,409 discloses a roll-to-roll type continuous plasma CVD apparatus capable of continuously forming such stacked body. Particularly, the plasma CVD apparatus disclosed in this document comprises a plurality of plasma discharge deposition chambers capable of being evacuated each for forming a desired semiconductor layer by causing plasma discharge therein, said plurality of plasma discharge deposition chambers being communicated with each other, wherein an elongated substrate (a web substrate) having flexibility and having a desired width is moved in the longitudinal direction and along a prescribed pathway for the substrate to be moved to sequentially pass through the plasma discharge deposition chambers while forming a desired semiconductor layer on the substrate by each plasma discharge deposition chamber, whereby an semiconductor element having a desired semiconductor junction is continuously formed on the substrate. In this plasma CVD apparatus, in order to prevent a raw material gas containing a dopant which is used in one of the plasma discharge deposition chambers from being diffused or contaminated into the other plasma discharge deposition chamber which is situated next to said plasma discharge deposition chamber, a gas gate is provided between each adjacent plasma discharge deposition chambers. Particularly, there is adopted a manner in that a gas gate is established between each adjacent plasma discharge deposition chambers by providing an isolation passageway in a slit-like form between the two discharge deposition chambers and flowing a scavenging gas such as Ar gas or $H_2$ gas into said isolation passageway, and by said gas gate, a raw material gas introduced in one plasma discharge deposition chamber is prevented from being invaded into the other plasma discharge deposition chamber situated next to said plasma discharge deposition chamber.

However, in the case of forming a semiconductor layer in accordance with such semiconductor layer-forming method using the above described roll-to-roll plasma CVD apparatus, there are such disadvantages as will be described below.

(1) When a plasma is continuously generated over a large area in the processing chamber (the plasma discharge deposition chamber) over a long period of time in order to continuously form a semiconductor layer on a substrate therein, there is a tendency of entailing a disadvantage such that the temperature of the circumferential wall of the processing chamber is gradually increased with the passage of time to exert an influence to the temperature of said substrate on which said semiconductor layer is formed, where this situation makes it almost impossible to maintain the substrate at a temperature in a prescribed temperature range. Thus, when a semiconductor device is continuously formed over a long period of time, there is a tendency in that the resulting semiconductor devices have a variation in their characteristics with time.

(2) As described in the above (1), the temperature of the circumferential wall of the processing chamber is increased with the passage of time. Therefore, upon conducting maintenance work of the apparatus after the completion of the layer-forming process, it is necessary to cool not only the processing chamber but also members around the processing chamber until they become to have a temperature which enables a worker to conduct the maintenance work this situation entails disadvantages such that a long period time is necessitated to be spent in the maintenance work because it takes a long period time until the processing chamber and the members around the processing chamber are cooled as above described and as a result, the operating efficiency of the apparatus is remarkably decreased.

Now, for a solar cell power generation apparatus obtained by electrically connecting a plurality of unit solar cell modules in series connection or parallel connection into an integrated body, in order make the solar cell power generation apparatus have an improved photoelectric conversion efficiency and a improved characteristic stability, it is preferred that each unit solar cell module has a photoelectric conversion efficiency which is as high as possible and a characteristic degradation ratio which is as low as possible. Further, when because the characteristic of the integrated body as a whole is governed by that of one of said plurality of unit solar cell modules which outputs a minimum electric current or a minimum voltage, it is very important to make the respective unit solar cell modules have an improved average characteristic and to make them such that a variation in their characteristics is quite small. For this purpose, at least at a stage of preparing said plurality of unit solar cell modules, it is necessary that a semiconductor layer constituting each unit solar cell module which is an utmost decisive factor to determine the characteristic of said solar cell module is formed to have an uniform property. The foregoing semiconductor layer-forming method using the roll-to-roll type plasma CVD apparatus is not appropriate to sufficiently satisfy this requirement because as described in the above (1), when a semiconductor device is continuously formed over a long period of time, there is a disadvantage in that the resulting semiconductor devices tend to have a variation in their characteristics with time. Further, in order to reduce the production cost of a product, it is necessary to decrease the working period of time required for conducting the maintenance and the like for the apparatus as short as possible whereby increase the operating efficiency of the apparatus. However, this purpose cannot be sufficiently attained in the case of using the foregoing roll-to-roll type plasma CVD apparatus, because as described in the above (2), a long period time is necessitated to be spent in the maintenance work for the apparatus.

Thus, although the foregoing roll-to-roll type plasma CVD apparatus is suitable for mass-producing a semiconductor device having a relatively small area, it is difficult to efficiently mass-produce a semiconductor device having a relatively large area and having a stable characteristic.

The foregoing disadvantages will be more or less entailed in the case of vacuum-processing a substrate over a long period of time.

SUMMARY OF THE INVENTION

An principal object of the present invention is to solve the foregoing disadvantages in the prior art and to provide a vacuum-processing apparatus which can be operated at a high operating efficiency without entailing such disadvantages and which enables one to efficiently produce a semiconductor device (including a photoelectric conversion element) having a large area and having stable and uniform characteristics at a reasonable production cost.

Another object of the present invention is to provide a vacuum-processing method using said apparatus and which enables one to efficiently produce a semiconductor device (including a photoelectric conversion element) having a large area and having stable and uniform characteristics at a reasonable production cost.

A further object of the present invention is to provide a vacuum-processing apparatus in which an object having a large area to be processed can be readily controlled to have a prescribed temperature and said object can be efficiently processed as desired, and maintenance for said apparatus can be readily conducted.

A further object of the present invention is to provide a vacuum-processing method using said vacuum-processing apparatus, in which an object having a large area to be processed can be readily controlled to have a prescribed temperature and said object can be efficiently processed as desired.

A further object of the present invention is to provide a vacuum-processing apparatus comprising a vacuum vessel whose inside being capable of being evacuated, a processing chamber arranged in said vacuum vessel and a heater for heating a circumferential wall of said processing chamber, wherein a substrate is arranged in said processing chamber and said substrate is processed in said processing chamber while maintaining said substrate at a prescribed temperature and introducing a processing gas therein under reduced pressure, characterized in that said vacuum-processing apparatus has a cooling plate arranged at a position to oppose said circumferential wall of said processing chamber for cooling said circumferential wall of said processing chamber, and a mechanism for moving said cooling plate so as to change a distance between said cooling plate and said circumferential wall of said processing chamber A further object of the present invention is to provide a vacuum-processing method using a vacuum-processing apparatus comprising a vacuum vessel whose inside being capable of being evacuated, a processing chamber arranged in said vacuum vessel and a heater for heating a circumferential wall of said processing chamber, a cooling plate arranged at a position to oppose said circumferential wall of said processing chamber for cooling said circumferential wall of said processing chamber, and a mechanism for moving said cooling plate so as to change a distance between said cooling plate and said circumferential wall of said processing chamber, characterized in that said vacuum-processing method comprises the steps of (a) arranging a substrate in said processing chamber, (b) subjecting said substrate arranged in said processing chamber to a surface treatment while maintaining said substrate at a prescribed temperature and introducing a processing gas into said processing chamber, and (c) preventing a temperature rise of said circumferential wall of said processing chamber which is occurred in said step (b), by virtue of a heat exchange action between said cooling plate and said circumferential wall of said processing chamber.

BRIEF DESCRIPTION OF THE DRAWINGS

FIG. 4 is a graph showing temperature changes with time of circumferential walls of processing chambers obtained in Example 5 including comparative example which will be described later.

DESCRIPTION OF THE INVENTION AND PREFERRED EMBODIMENTS

Figure 1:
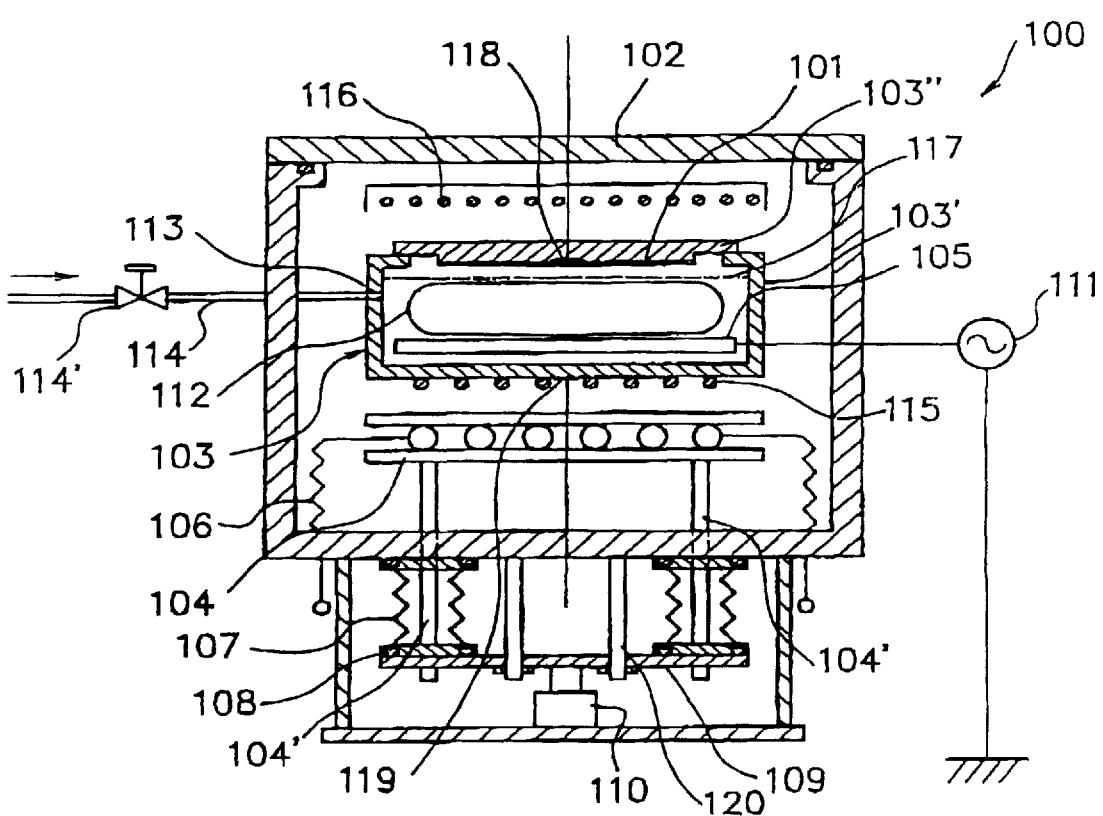
FIG. 1 is a schematic diagram illustrating an example of a vacuum-processing apparatus of the present invention.

The present invention eliminates the foregoing disadvantages in the prior art and attains the above described objects.

As previously described, the present invention provides a vacuum-processing apparatus comprising a vacuum vessel whose inside being capable of being evacuated, a processing chamber arranged in said vacuum vessel and a heater for heating a circumferential wall of said processing chamber, wherein a substrate is arranged in said processing chamber and said substrate is processed in said processing chamber while maintaining said substrate at a prescribed temperature and introducing a processing gas therein under reduced pressure, characterized in that said vacuum-processing apparatus has cooling plate arranged at a position to oppose said circumferential wall of said processing chamber for cooling said circumferential wall of said processing chamber, and a mechanism for moving said cooling plate so as to change a distance between said cooling plate and said circumferential wall of said processing chamber.

The present invention includes a vacuum-processing method using aforesaid vacuum-processing apparatus, characterized in that said vacuum-processing method comprises the steps of (a) arranging a substrate in said processing chamber, (b) subjecting said substrate arranged in said processing chamber to a surface treatment while maintaining said substrate at a prescribed temperature and introducing a processing gas into said processing chamber, and (c) preventing a temperature rise of said circumferential wall of said processing chamber which is occurred in said step (b), by virtue of a heat exchange action between said cooling plate and said circumferential wall of said processing chamber.

In the present invention, by providing the cooling plate for cooling the circumferential wall of the processing chamber in addition to the heater for heating the circumferential wall of the processing chamber, the temperature rise of the circumferential wall of the processing chamber which is occurred due to heat generated when the substrate is processed in the processing chamber prevented by virtue of a heat exchange action between the cooling plate and the circumferential wall of the processing chamber.

Further, in the present invention, the mechanism for moving the cooling plate is provided so as to change the distance (the interval) between the cooling plate and the circumferential wall of the processing chamber, where, for instance, the cooling plate is designed so that it can be moved. By this, it is possible that the distance (the interval) between the cooling plate and the circumferential wall of the processing chamber is adequately changed to control a heat exchange quantity between the cooling plate and the processing chamber, whereby the temperature of the circumferential wall of the processing chamber is maintained at a desired temperature which is suitable for subjecting the substrate to a surface treatment in the processing chamber. In this case, after the surface treatment for the substrate in the processing chamber has been completed, by contacting the cooling plate to the circumferential wall of the processing chamber, it is possible to cool the circumferential wall of the processing chamber to a desired temperature within a short period of time.

In the vacuum-processing apparatus of the present invention, it is preferred that a fluctuation mechanism member for retaining the cooling plate is provided at an exterior of the vacuum vessel and the cooling plate is connected to the fluctuation mechanism member and that a driving mechanism is provided at a position outside the vacuum vessel and it is connected to the fluctuation mechanism member. By doing in this way, it is possible to install the driving mechanism not in the vacuum atmosphere but in the open air atmosphere, where the driving mechanism is not necessary to have a costly air-tight structure.

In the above, it is preferred to provide a vacuum-sealing member at a portion of the fluctuation mechanism member which is protruded from the vacuum vessel (a portion of the fluctuation mechanism member which is contacted with the member constituting the circumferential was of the vacuum vessel) in order to hermetically seal the inside of the vacuum vessel. The vacuum-sealing member is preferred to comprise a flexible vacuum-sealing member. In this case, the flexible vacuum-sealing member is capable of being deformed depending on the movement of the cooling plate and therefore, the cooling plate can be smoothly moved.

In the vacuum-processing apparatus of the present invention, in order that the circumferential wall of the processing chamber is maintained at a desired temperature which is suitable for processing the substrate, it is preferred to provide an adjusting means for adjusting the cooling plate to situate at a desired position so that a desired distance (a desired interval) is established between the cooling plate and the circumferential wall of the processing chamber. Said adjusting means is preferred to comprise, for instance, a position-detecting sensor for detecting the position where the cooling plate is situated and a control mechanism capable of actuating the driving means depending on a signal transmitted from the position-detecting sensor.

The vacuum-processing apparatus of the present invention can be desirably used as an apparatus for processing a substrate in that using a film-forming raw material gas as the processing gas, a functional deposited film is formed on the substrate by means of a plasma CVD method.

In the present invention, the substrate may comprise an elongated substrate (that is, a web substrate). In this case, the vacuum-processing apparatus of the present invention may be designed such that a transportation means for transporting said web substrate is provided, and a plurality of processing chambers are arranged in a passage of transporting said web substrate such that they are communicated with each other and where the foregoing vacuum vessel is arranged to include some of the processing chambers, wherein the web substrate is continuously transported to pass through the vacuum vessel while conducting a desired surface treatment for the web substrate by each of the processing chambers in the vacuum vessel. Such vacuum-processing apparatus is suitable for producing a photoelectric conversion element comprising a plurality of semiconductor layers including one or more amorphous semiconductor layers which are stacked on a given substrate.

In the following, the features and advantages of the present invention will be described in more detail by illustrating examples. It should be understood that these examples are only for illustrative purposes and are not intended to restrict the scope of the present invention. These examples may be optionally modified within a range in that the principle of the present invention is not changed.

EXAMPLE 1

FIG. 1 is a schematic diagram illustrating an example of a vacuum-processing apparatus of the present invention. In FIG. 1, reference numeral 100 indicates a vacuum-processing apparatus. As shown in FIG. 1, the vacuum-processing apparatus 100 has a vacuum vessel 102 whose inside is capable of being evacuated to be a reduced pressure state. In the inside of the vacuum vessel 102, there is provided a vacuum-processing chamber 103 constituted by a circumferential wall 103' having a substrate-retaining member 103" which is detachably joined with said circumferential wall 103'. Reference numeral 101 indicates a substrate arranged on the substrate-retaining member 103" so as to downward face the inside of the vacuum-processing chamber 103. The vacuum-processing chamber 103 is used for vacuum-processing the substrate 101 arranged on the substrate-retaining member 103" of the circumferential wall 103'.

The vacuum-processing for the substrate 101 include deposition treatment of a deposited film [such as a semiconductor film (layer)] on the substrate, etching treatment for the substrate, deaeration treatment for the substrate, and the like.

The vacuum processing chamber 103 is provided with a processing gas introduction port 113 to which a processing gas feed pipe 114 is connected. The processing gas feed pipe 114 is provided with a throttle valve 114' and it is extending from a processing gas supply system (not shown) The vacuum processing chamber 103 is provided with an exhaustion port 112 to which an exhaust pipe (not shown) is connected. The exhaust pipe is provided with a throttle valve (not shown) and it is connected to a vacuum pump (not shown). Reference numeral 105 indicates a power application electrode provided in the inside of the processing vacuum chamber 103 in order to generate plasma discharge in the processing vacuum chamber 103.

The power application electrode 105 is electrically connected to a power source 111 (comprising, for instance, a high frequency power source).

Reference numeral 117 indicates a shutter provided in the processing vacuum chamber 103. The shutter 117 serves to protect the substrate 101 upon generating plasma discharge in the processing vacuum chamber 103.

Reference numeral 116 indicates a substrate-heating means (comprising a infrared lamp heater unit) which is provided in the vacuum vessel 102 so as to oppose the substrate 101 arranged in the vacuum-processing chamber 103.

The heating means 116 serves to heat the substrate 101 to a desired temperature which is suitable for processing the substrate 101, specifically, for instance, for conducting deposition treatment of a deposited film onto the substrate 101.

Reference numeral 118 indicates a thermocouple which is provided in the vicinity of the substrate 101 in order to control the temperature of the substrate 101.

Reference numeral 115 indicates a wall heater which is provided at an exterior face of the circumferential wall of the vacuum-processing chamber 103 in order to heat the circumferential wall of the vacuum-processing chamber 103 to a desired temperature suitable for processing the substrate 101. Reference numeral 119 indicates a thermocouple provided at the wall heater 115 in order to control the temperature of the circumferential wall of the vacuum-processing chamber 103 which is heated by the wall heater 115.

At a position in the vacuum vessel 102 which is opposed to the circumferential wall of the vacuum-processing chamber 103, there is provided a cooling plate 104 having a flow pathway 106 in which a cooling medium is flown in order to cool the circumferential wall of the vacuum-processing chamber 103 by the cooling plate 104. The cooling plate 104 is retained by a pair of shafts 104' which are extended to outside the vacuum vessel 102 through the lower wall of the vacuum vessel as shown in FIG. 1.

Reference numeral 109 indicates a fluctuation mechanism member which is provided over an exterior of the vacuum vessel 102. The fluctuation mechanism member 109 is connected to the cooling plate 104 through the shafts 104' connected to the cooling plate 104.

Particularly, the fluctuation mechanism 109 comprises a pair of bellows 107 and a pair of guide rails 120, where each bellows 107 contains an externally extended portion of one of the shafts 104' extended from the inside of the vacuum vessel 102 so as to hermetically cover said externally extended portion of the shaft 104' as shown in FIG. 1, and the pair of guide rails 120 are provided between the pair of bellows 107. Each bellows comprises a flexible vacuum-sealing member. Reference numeral 110 indicates a cylinder which is connected to the fluctuation mechanism member 109. By driving the cylinder 110, the fluctuation mechanism member 109 can be shifted. By shifting the fluctuation mechanism member 109 in this way, it is possible to ascend or descend the cooling plate 104 so as to change the distance (the interval) between the cooling plate 104 and the vacuum-processing chamber 103.

The bellows 107 are capable of being deformed depending on the movement of the cooling plate 104 and therefore, the cooling plate 104 can be smoothly moved. At each connection portion between the vacuum vessel 102 and the bellows 107 and also at each of other connection portions of the bellows 107 in the fluctuation mechanism member 109, there is provided an O-ring 108 in order to maintain the inside of the vacuum vessel in an air-tightened state.

In the following, detailed description will be made of principal constituents of the vacuum-processing apparatus 100 shown in FIG. 1 and of related factors upon conducting vacuum-processing for the substrate in the vacuum-processing apparatus.

Cooling Plate

In this embodiment, the cooling plate 104 capable of being shifted as above described is installed in the vacuum vessel 102 such that it is situated at a position opposed to the substrate-retaining member 103" (having the substrate 101 arranged thereon) as part of the circumferential wall 103' of the vacuum-processing chamber 103. The cooling plate 104 is preferred to comprise a cooling plate provided with a cooling medium flow pathway 106 in which a cooling medium is flown, as above described.

The cooling medium flow pathway 106 is preferred to be constituted by a metallic material having heat resistance and corrosion resistance such as a stainless steel or the like. In the case where consideration should be made particularly of the thermal conductivity, the cooling medium flow pathway may be constituted by an aluminum material or a copper material.

The cooling plate 104 be designed to have a structure comprising a pair of keep plates and a pipe-like shaped cooling medium flow pathway 106 constituted by a given metallic material which is sandwiched between said pair of keep plates. Besides, the cooling plate 104 may comprise a metallic member having a cavity formed by way of cutting process. Alternatively, The cooling plate 104 may comprise a metal body having a cooling medium flow pathway obtained by subjecting a plurality of metallic members to special processing by way of electric discharge machining (EDM) or welding to form said body having a cooling medium flow pathway.

As the heat transferring method between the circumferential wall of the vacuum-processing chamber 103 and the cooling plate 104 in order to maintain the circumferential wall of the vacuum-processing chamber 103 at a desired temperature, it is desired to chiefly adopt a method of causing heat transfer between them by virtue of convection and radiative heat transfer without contacting the cooling plate 104 with the circumferential wall of the vacuum-processing chamber 103. In this case, in order to improve the heat transfer efficiency (the heat exchange efficiency) of the convection and radiative heat transfer, it is possible to provide a fin having irregularities at an inside portion of the circumferential wall of the vacuum-processing chamber 103 or/and in the cooling plate 104. Further, with consideration of the emissivity, it is possible to provide a metal thin film having a high emissivity on a heat-radiating face side of the circumferential wall of the vacuum-processing chamber 103 by way of coating or plating. It is also possible to provide a metal thin film having a heat absorption coefficient on a heat-absorbing face side of the cooling plate 104 by way of coating or plating.

Separately, in order to make the temperature of the circumferential wall of the vacuum-processing chamber 103 to be suitable to a method adopted for processing the substrate 101, it is possible to adopt a mechanism which makes it to rest the cooling plate 104 at a position where the distance (the interval) between the cooling plate 104 and the circumferential wall of the vacuum-processing chamber 103 becomes constant at a prescribed value during the vacuum-processing of the substrate 101. The distance (the interval) in this case should be determined depending on the characteristic of the cooling plate 104 and that of the circumferential wall of the vacuum-processing chamber 103. Besides, it is possible to adopt a control mechanism capable of controlling the position of the cooling plate 104 by monitoring the temperature of the circumferential wall of the vacuum-processing chamber 103 by a temperature-monitoring means and detecting the position of the cooling plate 104 by a position-detecting sensor, also during the vacuum-processing of the substrate 101.

Incidentally, after the vacuum-processing for the substrate has been completed, it is necessary to conduct maintenance for the apparatus. In the prior art, this maintenance can not be conducted until the vacuum-processing chamber and the members situated in the vicinity thereof are cooled to have a temperature which makes a maintenance worker to be possible to work. In this case, it tales a long period of time until the vacuum-processing chamber and the members situated in the vicinity thereof are cooled to have such temperature. This situation entails a loss of time. In the present invention, in order to diminish such time lose, it is possible to make such that the cooling plate 104 is directly contacted with the circumferential wall of the vacuum-processing chamber 103. In this case, after the vacuum-processing for the substrate has been completed, the cooling plate 104 is moved to directly contact with the circumferential wall of the vacuum-processing chamber 103.

Now, to move the cooling plate 104 to ascend or descend is preferred to conducted by driving the cylinder 110 as previously described. To drive the cylinder 110 may be conducted by a compressed air driving manner in which a pressure of a fluid comprising a compressed air or the like is effected. Besides, a hydraulic driving manner may be employed. In any case, it is preferred to employ an appropriate driving manner in order to drive the cylinder 110 with considering the scale or the like of the vacuum-processing apparatus 100.

Separately, by using the flexible vacuum-sealing member 107 in the vacuum-sealing portion in order to maintain the inside of the vacuum vessel 102 in an air-tightened state as previously described, it is possible that the cylinder 110 is installed in an open air environment outside the vacuum-sealing portion, that is, outside the vacuum vessel 102. In this case, because the cylinder 110 is not installed in the vacuum environment, the cylinder 110 is not necessary to have a costly air-tight structure. This situation leads to diminishing the production cost of the vacuum-processing apparatus.

Substrate

The vacuum-processing apparatus 100 in this example may be desirably used for the preparation of a semiconductor element such as a solar cell or the like. In the case of preparing a solar cell, the substrate 101 is preferred be constituted by an appropriate material which is difficult to be deformed or distorted at a temperature in the formation of a semiconductor layer and has a sufficient physical strength.

Specifically, the substrate may comprise a metal selected from a group consisting of Al, Fe, and Cu; an alloy selected from a group consisting of alloys of these metals such as stainless steels; or a material selected from a group consisting of composites of these alloys.

Besides, the material by which the substrate is constituted can include thin plates made of said metals or said alloys having a surface coated by a metal thin film made of a different metal or/and an electrically insulative thin film of $SiO_2$, $Si_3N_4$, $Al_2O_3$, or $AlN_3$ by way of sputtering, vacuum deposition, or plating.

Alternatively, the substrate may comprise a heat-resistant resin sheet wade of a heat-resistant synthetic resin such as polyimide, polyamide, polyethylene terephthalate, or epoxy resin, having a surface applied with electrically conductive treatment using a metal, an alloy or a transparent electrically conductive oxide (TCO) by means of plating, vacuum evaporation, sputtering, or coating. Besides, the substrate may comprise a composite comprising said heat-resistant resin sheet and a glass fiber, a carbon fiber, or a metallic fiber, having a surface applied with electrically conductive treatment using a metal, an alloy or a transparent electrically conductive oxide (TCO) by means of plating, vacuum evaporation, sputtering, or coating.

In the case of using a web-like shaped substrate (that is, a web substrate) as the substrate 101, the thickness thereof is desired to be as thinner as possible in view of the cost benefit and the storage space as long as it can maintain an adequate strength upon transporting it by a transportation means. Specifically, the web substrate is desired to have a thickness preferably in a range of from 0.01 mm to 5 mm, more preferably in a range of from 0.02 mm to 2 mm, most preferably in a range of from 0.05 mm to 1 mm. In the case where the web substrate comprises an elongated thin plate made or a metal or the like, even when the thickness thereof is relatively thinned, a prescribed strength can be readily achieved.

There is no particular limitation for the width of the web substrate. The width should be determined depending upon the size of the vacuum-processing apparatus or that of the vacuum vessel 102. Similarly, there is no particular limitation for the length of the web substrate. The web substrate may be of a length which can be wound in a roll form. The web substrate may comprise an elongated belt-like substrate connected to another elongated belt-like substrate by means of welding or the like.

The web substrate may have a smooth surface or an irregular surface comprising a number of minute irregularities. Such irregular surface may comprise a number of spherical, conic, or pyramid-like irregularities with an average peak-to-valley elevation in a rage of from 50 nm to 500 nm. In this case, reflection of light at such Irregular surface becomes irregular reflection to prolong the optical path of reflected light.

Semiconductor Layer

Description will be made of a semiconductor layer for a solar cell, which can be desirably formed on the substrate 101 by way of deposition treatment in the vacuum-processing apparatus 100 in this example.

The semiconductor layer used in the solar cell typically comprises an n-type semiconductor layer, an i-type semiconductor layer and a p-type semiconductor layer The i-type semiconductor layer may comprise a group IV series non-single crystalline semiconductor material or a group IV alloy series non-single crystalline semiconductor material. Such non-single crystalline semiconductor material can include amorphous silicon (a-Si) series materials such as a-Si:H, a-Si:F, a-Si:H:F, a-SiC:H, a-SiC:F, a-SiC:H:F, a-SiGe:H. a-SiGe:F, a-SiGe:H:F, and the like; microcrystalline silicon ($\mu$c-Si) series materials such as $\mu$c-Si:H, $\mu$c-Si:F, $\mu$c-Si:H:F, $\mu$c-SiC:H, $\mu$c-SiC:F, $\mu$c-SiC:H:F, $\mu$c-SiGe:H, $\mu$c-SiGe:F, $\mu$c-SiGe:H:F, and the like; and polycrystalline silicon (poly-Si) series materials such as poly-Si:H, poly-Si:F, poly-Si:H:F, and the like.

Such non-single crystalline semiconductor material to constitute the i-type semiconductor layer is desired to contain hydrogen atom or/and halogen atoms in an amount of preferably 20 atomic % or less, or more preferably 10 atomic % or less.

Each of the n-type semiconductor layer and the p-type semiconductor layer may comprise any of the above-mentioned non-single crystalline semiconductor materials to constitute the i-type semiconductor layer, which are doped with an n-type valence electron controlling agent or a p-type valence electron controlling agent. The n-type valence electron controlling agent can include elements of group V of the periodic table such as P, As, Sb, and Bi. The p-type valence electron controlling agent can include elements of group III of the periodic table such as B, Al, Ga. In, and Ti.

As the non-single crystalline semiconductor material to constitute the n-type semiconductor layer or the p-type semiconductor layer, it is desired to use a non-single crystalline semiconductor material selected from those non-single crystalline semiconductor materials mentioned in the above, which contains crystalline phases, in order to improve the utilization efficiency of light and the photocarrier density.

As well as in the case of the i-type semiconductor layer, the non-single crystalline semiconductor material to constitute each of the n-type semiconductor layer and the p-type semiconductor layer is desired to contain hydrogen atoms or/and halogen atoms in an amount of preferably 5 atomic % or less, or more preferably 1 atomic % or less.

A semiconductor layer as the i-type semiconductor layer, the n-type semiconductor layer or the p-type semiconductor layer comprising a given group IV series non-single crystalline semiconductor material or a given group IV alloy series non-single crystalline semiconductor material may be formed by introducing an appropriate gaseous raw material into the vacuum-processing chamber 103. Such gaseous raw material can include gaseous or easily gasifiable silicon-containing compounds, gaseous or easily gasifiable germanium-containing compounds, gaseous or easily gasifiable carbon-containing compounds, and mixtures of these compounds.

The gaseous or easily gasifiable silicon-containing compound can include chain silane compounds and cyclic silane compounds. Specific examples of such compound are $SiH_4$, $Si_2H_6$, $SiF_4$, $SiFH_3$, $SiF_3H_2$, $SiF_3H$, $Si_3H_8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$, and $Si_2Cl_3F_3$ which are gaseous or easily gasifiable.

Specific examples of the gaseous or easily gasifiable germanium-containing compound are $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, and $Ge_2D_6$.

Specific examples of the gaseous or easily gasifiable carbon-containing compound are $CH_4$, $CD_4$, $C_nH_{2n+2}$ (with n being an integer), $C_nH_{2n}$, (with n being an integer), $C_2H_2$, $C_6H_6$, $CO_2$, and CO.

The starting material for the introduction of the group III element as the p-type valence electron controlling agent can include boron hydrates such as $B_2H_6$, $B_4H_{10}$, $B_5H_9$, $B_5H_{11}$, $B_6H_{10}$, $B_6H_{12}$, and $B_6H_{14}$, and boron halides such as $BF_3$, and $BCl_3$. Besides, $AlCl_3$, $GaCl_3$, $InCl_3$ and $TlCl_3$ are also usable. Of these, $B_2H_6$ and $BF_3$ ae particularly suitable.

The starting material for the introduction of the group V element as the n-type valence electron controlling agent can include phosphorous hydrides such as $PH_3$, and $P_2H_4$, and phosphorous halides such as $PH_4I$, $PF_3$, $PF_5$, $PCl_3$, $PCl_5$, $PBr_3$, and $PI_3$. Besides, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ are also usable. Of these, $PH_3$ and $PF_3$ are particularly suitable.

Any of the foregoing compounds may be introduced into the vacuum-processing chamber 103 while being mixed with an inert gas such as He gas, Ne gas, Ar gas, Kr gas, Xe gas, or Rn gas, or a dilution gas such as $H_2$ gas, HF gas, or HCl gas.

Description will be made of a method of forming a semiconductor layer on the substrate 101 by operating the vacuum-processing apparatus 100 by referring to an example in that a glass plate having a size of 30 cm×30 cm is used as the substrate 101, $SiH_4$ gas and $H_2$ gas are used as the processing gas, and an amorphous silicon semiconductor layer is formed on the substrate 101.

That is, the glass plate as the substrate 101 was arranged on the substrate-retaining member 103" of the circumferential wall of the vacuum-processing chamber 103. The inside of the vacuum-processing chamber 103 was evacuated to a prescribed vacuum, followed by introducing a processing gas (comprising $SiH_4$ gas and $H_2$ gas) into the vacuum-processing chamber 103 through the gas feed pipe 114. Constant-temperature water of 20° C. was flown in the cooling medium flow pathway 106 provided in the cooling plate 104 at 5 liters/minute. By actuating the fluctuation mechanism member 109 while detecting the position of the cooling plate 104 by a position-detecting sensor (not shown in the figure), the cooling plate 104 was fixed at a position where an interval (a distance) of 10 cm was maintained between a face of the cooling plate 104 and a face of the circumferential wall of the vacuum-processing chamber 103 which is opposed to said face of the cooling plate 104. Then, the inner pressure (the gas pressure) in the vacuum-processing chamber 103 was maintained at 1 Torr (1.33 hPa), and while maintaining the shutter 117 in a closed state, the high frequency power source 111 was switched on to apply a high frequency power with a frequency of 13.56 MHz into the vacuum-processing chamber 103 through the power application electrode 105 whereby generating plasma discharge in the vacuum-processing chamber 103. After the plasma discharge became stable, the shutter 117 was opened, whereby an amorphous silicon film having a thickness of 2 $\mu$m as an amorphous semiconductor layer was deposited on the substrate 101. Thereafter, the shutter 117 was closed, and the substrate 101 was replaced by another substrate. The time spent in completing the film-forming procedures was 90 minutes. The above procedures were repeated 100 times, where the temperature of the circumferential wall of the vacuum-processing chamber 103 could be controlled to be substantially constant at 250° C. which was the initial temperature.

Separately, for the comparison purpose, the forgoing film-forming procedures were conducted in a modification of the vacuum-processing apparatus 100 in that the cooling plate 104 is omitted. In this case, from the stage where the film-forming procedures were repeated about 35 times, the temperature of the circumferential wall of the vacuum-processing chamber 103 started increasing to more than 270° C. and thereafter, it became substantially impossible to control the temperature of the circumferential wall of the vacuum-processing chamber 103. After the film-forming procedures were repeated 100 times, the temperature of the circumferential wall of the vacuum-processing chamber 103 was found to be more than 400° C.

As the above results illustrate, it is understood that in the vacuum-processing apparatus 100 in this example, even when the deposition treatment for the substrate is continuously repeated over a long period of time, the temperature of the substrate 101 and that of the vacuum-processing chamber 103 can be maintained to be constant at a desired temperature which is suitable for the deposition treatment, and because of this, a semiconductor layer having a stable property can be efficiently and continuously formed.

EXAMPLE 2

Figure 2:
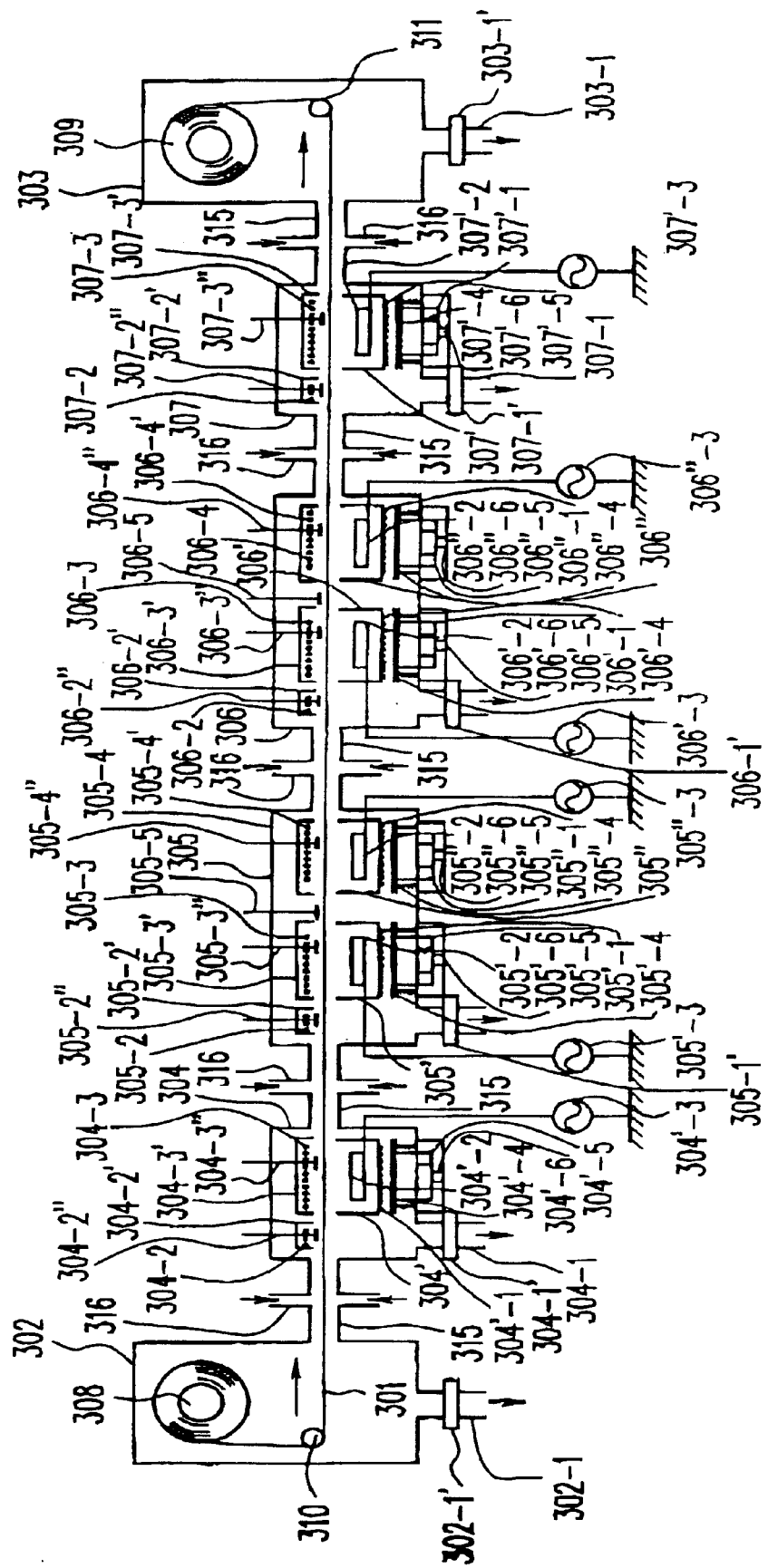
FIG. 2 is a schematic diagram illustrating another example of a vacuum-processing apparatus of the present invention.

FIG. 2 is a schematic diagram illustrating an example of a vacuum-processing apparatus of the present invention. In FIG. 2, reference numeral 301 indicates a web substrate, and reference numeral 302 a substrate delivery vacuum vessel in which a pay-out bobbin 308 having the web substrate 301 wound thereon in a coil form is installed. The substrate delivery vacuum vessel 302 is provided with an exhaust pipe 302-1 provided with a throttle valve 302-1' and which is connected to a vacuum pump (not shown). Reference numeral 303 indicates a substrate take-up vacuum vessel in which a take-up bobbin 309 for taking up the web substrate 301 thereon while being wound thereon in a coil form is installed. The substrate take-up vacuum vessel 303 is provided with an exhaust pipe 303-1 provided with a throttle valve 303-1' and which is connected to a vacuum pump (not shown).

Reference numeral 304 indicates a first vacuum vessel provided with an exhaust pipe 304-1 provided with a throttle valve 304-1' and which is connected to a vacuum pump (not shown). The first vacuum vessel 304 in this example is used for forming an n-type semiconductor layer on the web substrate 301.

Reference numeral 305 indicates a second vacuum vessel provided with an exhaust pipe 305-1 provided with a throttle valve 305-1' and which is connected to a vacuum pump (not shown). The second vacuum vessel 305 in this example is used for forming an i-type semiconductor layer on the web substrate 301.

Reference numeral 306 indicates a third vacuum vessel provided with an exhaust pipe 306-1 provided with a throttle valve 306-1' and which is connected to a vacuum pump (not shown). The third vacuum vessel 306 in this example is used for conducting a plasma treatment for a layer formed on the web substrate 301.

Reference numeral 307 indicates a fourth vacuum vessel provided with an exhaust pipe 307-1 provided with a throttle valve 307-1' and which is connected to a vacuum pump (not shown). The fourth vacuum vessel 307 in this example is used for forming a p-type semiconductor layer on the web substrate 301.

The substrate delivery vacuum vessel 302 and the first vacuum vessel 304 are communicated with each other through a gas gate 315 through which the substrate web 301 is transported from the former vessel to the latter vessel; the first vacuum vessel 304 and the second vacuum vessel 305 are communicated with each other through a gas gate 315 through which the substrate web 301 is transported from the former vessel to the latter vessel; the second vacuum vessel 305 and the third vacuum vessel 306 are communicated with each other through a gas gate 315 through which the substrate web 301 is transported from the former vessel to the latter vessel; the third vacuum vessel 306 and the fourth vacuum vessel 307 are communicated with each other through a gas gate 315 through which the substrate web 301 is transported from the former vessel to the latter vessel; and the fourth vacuum vessel 307 and the substrate take-up vacuum vessel 303 are communicated with each other through a gas gate 315 through which the substrate web 301 is transported from the former vessel to the latter vessel.

Each gas gate 315 is provided with a gate gas (a separation gas) introduction pipe 316. For the gas gate 315, separation gas such as $H_2$ gas or inert gas is introduced thereinto through the separation gas introduction pipe 316. The gas gate 315 serves to isolate the adjacent vacuum vessels one from the other by introducing such separation gas into the gas gate to prevent the gas used in one vacuum vessel from being mixed with the gas used in the other vacuum vessel, and it also serves to allow the web substrate web 301 to pass therethrough so as to continuously transport the web substrate.

The web substrate 301 wound on the pay-out bobbin 308 in the substrate delivery vacuum vessel 302 is paid out from the pay-out bobbin 308 and delivered through a steering roll 310, followed by being transported to sequentially pass through the vacuum vessels 304, 305, 306, and 307, and enters in the substrate take-up vacuum vessel 303 where it is taken up by and wound on the take-up bobbin 309 in a coil form through a steering roll, wherein by applying a desired torque to either the pay-out bobbin 308 or the take-up bobbin 309, a desired tension can be applied to the web substrate 301 in its transportation direction. In this case, the web substrate 301 is transported from the substrate delivery vacuum vessel 302 toward the substrate take-up vacuum vessel 303 by actuating a driving mechanism (not shown) connected to the take-up bobbin 309. However, it is possible to transport the web substrate 301 from the substrate take-up vacuum vessel 303 toward the substrate delivery vacuum vessel 302 by actuating a driving mechanism (not shown) connected to the pay-out bobbin 308. Separately, in the substrate take-up vacuum vessel 303, it is possible that an interleaf pay-out bobbin having an elongated protective interleaf wound thereon is provided and the interleaf is paid out from the interleaf pay-out bobbin so that the web substrate 301 is taken up by and wound on the take-up bobbin 309 together with the interleaf so as to protect the space of the web substrate. Alternatively, said interleaf pay-out bobbin may be provided in the substrate delivery vacuum vessel 302. The interleaf is preferred to be constituted by a heat-resistant resin such as polyimide resin or fluororesin (Teflon resin) or a glass wool.

Upon transporting the web substrate 301 from the substrate delivery vacuum vessel 302 to the substrate take-up vacuum vessel 303, the web substrate 301 sequentially passes through the vacuum vessels 304–307 while conducting a prescribed treatment for the web substrate 301 by each vacuum vessel (304, 305, 306, 307).

The transportation speed for the web substrate 301 should be determined depending upon related conditions involved.

In each of the vacuum vessels 304–307, there are provided a preheating means (comprising an infrared lamp heater unit) and at least one regular heating means (comprising an infrared lamp heater unit) above the passage of the web substrate 301 so as to heat the web substrate 301, where the preheating means is situated on an upstream side and it serves to provisionally heat the web substrate, and the regular heating means is situated on a downstream side and it serves to substantially heat the web substrate to a prescribed temperature suitable for a prescribed treatment which is conducted for the web substrate 301 in the vacuum vessel (304, 305, 306, 307), and a thermocouple is provided under each of the preheating means and the regular heating means in order to control the temperature of the web substrate heated by each heating means, and in addition, for each of the preheating means and the regular heating means, there is provided a reflector (a lamp house) in order to efficiently converge radiated heat toward the web substrate. Particularly, in the vacuum vessel 304, there are provided a preheating means 304-2 (comprising an infrared lamp heater unit) having a reflector 304-2' and a regular heating means 304-3 (comprising an infrared lamp heater unit) having a reflector 304-3', where a thermocouple 304-2" is provide under the preheating means 304-2 and a thermocouple 304-3" is provide under the regular heating means 304-3.

In the vacuum vessel 305, there are provided a preheating means 305-2 (comprising an infrared lamp heater unit) having a reflector 305-2', a first regular heating means 305-3 (comprising an infrared lamp heater unit) having a reflector 305-3', and a second regular heating means 305-4 (comprising an infrared lamp heater unit) having a reflector 305-4', where a thermocouple 305-2" is provide under the preheating means 305-2, a thermocouple 305-3" is provide under the first regular heating means 305-3, and a thermocouple 305-4" is provide under the second regular heating means 305-4. And there is also provided a thermocouple 305-5 at a position between the first regular heating means 305-3 and the second regular heating means 305-4.

In the vacuum vessel 306, there are provided a preheating means 306-2 (comprising an infrared lamp heater unit) having a reflector 306-2', a first regular heating means 306-3 (comprising an infrared lamp heater unit) having a reflector 306-3', and a second regular heating means 306-4 (comprising an infrared lamp heater unit) having a reflector 306-4', where a thermocouple 306-2" is provide under the preheating means 306-2, a thermocouple 306-3" is provide under the first regular heating means 306-3, and a thermocouple 306-4" is provide under the second regular heating means 306-4. And there is also provided a thermocouple 306-5 at a position between the first regular heating means 306-3 and the second regular heating means 306-4.

In the vacuum vessel 307, there are provided a preheating means 306-2 (comprising an infrared lamp heater unit) having a reflector 306-2' and a regular heating means 306-3 (comprising an infrared lamp heater unit) having a reflector 306-3', where a thermocouple 306-2" is provide under the preheating means 306-2 and a thermocouple 306-3" is provide under the regular heating means 306-3.

Now, in each of the vacuum vessels 304–307, there is provided at least one vacuum-processing chamber having a structure similar to the structure of the vacuum-processing chamber in the vacuum-processing apparatus shown in FIG. 1. That is, in each of the vacuum vessels 304–307, there is provided at least one vacuum-processing chamber formed by a circumferential wall having no wall on the side of the web substrate 301 such that the inner space (that is, the plasma discharge space) of the vacuum-processing chamber is exposed to the web substrate, where the vacuum-processing chamber is provided with a processing gas introduction means for introducing a prescribed processing gas thereinto; a power application electrode is provided in the inner space of the vacuum-processing chamber; at a back side portion of the circumferential wall of the vacuum-processing chamber which is opposed to the web substrate there are provided a wall heater for heating the circumferential wall to a prescribed temperature and a thermocouple for controlling the temperature of the circumferential wall; and at a position to oppose the wall heater provided at the circumferential wall of the vacuum-processing chamber, there is provided a cooling plate (corresponding to the foregoing cooling plate 104 in FIG. 1) which is connected a fluctuation mechanism member (corresponding to the foregoing fluctuation mechanism member 109 in FIG. 1) which is provided over an exterior of the vacuum chamber, and a cylinder (corresponding to the foregoing cylinder 110 in FIG. 1) is connected to the fluctuation mechanism member so that by driving the cylinder, the fluctuation mechanism member is shifted to ascend or descend the cooling plate so as to change the distance (the interval) between the cooling plate and the vacuum-processing chamber, where by virtue of a heat exchange action between the circumferential wall of the vacuum-processing chamber, the wall heater and the cooling plate, the circumferential wall of the vacuum-processing chamber is controlled to have an adequate temperature which is suitable for a desired processing treatment for the web substrate.

Particularly, in the vacuum vessel 304, there is provided a vacuum-processing chamber 304' such that the open face thereof is opposed to the regular heating means 304-3, where the vacuum-processing chamber 304' is provided with a processing gas introduction means (not shown) for introducing a prescribed processing gas thereinto; a power application electrode 304'-2 which is connected to a high frequency power source 304'-3 is provided in the inner space of the vacuum-processing chamber 304'; at a back side portion of the circumferential wall of the vacuum-processing chamber 304' which is opposed to the web substrate 301, there are provided a wall heater 304'-1 for heating the circumferential wall to a prescribed temperature and a thermocouple (not shown) for controlling the temperature of the circumferential wall; and at a position to oppose the wall heater 304'-1 provided at the circumferential wall of the vacuum-processing chamber 304', there is provided a cooling plate 304'-4 which is connected a fluctuation mechanism member 304'-5 which is provided over an exterior of the vacuum chamber 304, and a cylinder 304'-6 is connected to the fluctuation mechanism member 304'-5.

The vacuum-processing chamber 304' in the vacuum vessel 304 serves to foam an n-type semiconductor layer on the web substrate 301 which is maintained at a desired temperature by introducing a processing gas (comprising a prescribed raw material gas) into the vacuum-processing chamber 304' through the processing gas introduction means (not shown) and introducing a high frequency power from the high frequency power source 304'-3 into the vacuum-processing chamber 304' to cause plasma discharge and decompose the raw material gas whereby forming a functional deposited film as said n-type semiconductor layer on the web substrate 301.

In the vacuum vessel 305, there are provided a first vacuum-processing chamber 305' and a second vacuum-processing chamber 305" which are spacedly arranged in parallel to the web substrate 301.

The first vacuum-processing chamber 305' is provided such that the open face thereof is opposed to the first regular heating means 305-3, where the first vacuum-processing chamber 305' is provided with a processing gas introduction means (not shown) for introducing a prescribed processing gas thereinto; a power application electrode 305'-2 which is connected to a high frequency power source 305'-3 is provided in the inner space of the vacuum-processing chamber 305'; at a back side portion of the circumferential wall of the vacuum-processing chamber 305' which is opposed to the web substrate 301, there are provided a wall heater 305'-1 for heating the circumferential wall to a prescribed temperature and a thermocouple (not shown) for controlling the temperature of the circumferential wall; and at a position to oppose the wall heater 305'-1 provided at the circumferential wall of the vacuum-processing chamber 305', there is provided a cooling plate 305'-4 which is connected a fluctuation mechanism member 305'-5 which is provided over an exterior of the vacuum chamber 305, and a cylinder 305'-6 is connected to the fluctuation mechanism member 305'-5.

The second vacuum-processing chamber 305" is provided such that the open face thereof is opposed to the second regular heating means 305-4, where the second vacuum-processing chamber 305" is provided with a processing gas introduction means (not shown) for introducing a prescribed processing gas thereinto; a power application electrode 305"-2 which is connected to a high frequency power source 305"-3 is provided in the inner space of the vacuum-processing chamber 305"; at a back side portion of the circumferential wall of the vacuum-processing chamber 305" which is opposed to the web substrate 301, these are provided a wall heater 305"-1 for heating the circumferential wall to a prescribed temperature and a thermocouple (not shown) for controlling the temperature of the circumferential wall; and at a position to oppose the wall heater 305"-1 provided at the circumferential wall of the vacuum-processing chamber 305", there is provided a cooling plate 305"-4 which is connected a fluctuation mechanism member 305"-5 which is provided over an exterior of the vacuum chamber 305, and a cylinder 305"-6 is connected to the fluctuation mechanism member 305"-5.

The first vacuum-processing chamber 305' in the vacuum vessel 305 serves to form a first i-type semiconductor layer on the web substrate 301 which is maintained at a desired temperature by introducing a processing gas (comprising a prescribed raw material gas) into the vacuum-processing chamber 305' through the processing gas introduction means (not shown) and introducing a high frequency power from the high frequency power source 305'-3 into the vacuum-processing chamber 305' to cause plasma discharge and decompose the raw material gas whereby forming a functional deposited film as said first i-type semiconductor layer on the n-type semiconductor layer previously formed on the web substrate 301.

The second vacuum-processing chamber 305" in the vacuum vessel 305 serves to form a second i-type semiconductor layer on the web substrate 301 which is maintained at a desired temperature by introducing a processing gas (comprising a prescribed raw material gas) into the vacuum-processing chamber 305" through the processing gas introduction means (not shown) and introducing a high frequency power from the high frequency power source 305"-3 into the vacuum-processing chamber 305" to cause plasma discharge and decompose the raw material gas whereby forming a functional deposited film as said second i-type semiconductor layer on the first i-type semiconductor layer previously formed on the web substrate 301.

In the vacuum vessel 306, there are provided a first vacuum-processing chamber 306' as a first $H_2$ plasma processing chamber and a second vacuum-processing chamber 306" as a second $H_2$ plasma-processing chamber which are spacedly arranged in parallel to the web substrate 301.

The first vacuum-processing chamber 306' as the first $H_2$ plasma-processing chamber is provided such that the open face thereof is opposed to the first regular heating means 306-3, where the first vacuum-processing chamber 306' is provided with a processing gas introduction means (not shown) fox introducing a prescribed processing gas thereinto; a power application electrode 306'-2 which is connected to a high frequency power source 306'-3 is provided in the inner space of the vacuum-processing chamber 306'; at a back side portion of the circumferential wall of the vacuum-processing chamber 306' which is opposed to the web substrate 301, there are provided a wall heater 306'-1 for heating the circumferential wall to a prescribed temperature and a thermocouple (not shown) for controlling the temperature of the circumferential wall; and at a position to oppose the wall heater 306'-1 provided at the circumferential wall of the vacuum-processing chamber 306', there is provided a cooling plate 306'-4 which is connected a fluctuation mechanism member 306'-5 which is provided over an exterior of the vacuum chamber 306, and a cylinder 306'-6 is connected to the fluctuation mechanism member 306'-5.

The second vacuum-processing chamber 306" as the second H₂ plasma-processing chamber is provided such that the open face thereof is opposed to the second regular heating means 306-4, where the second vacuum-processing chamber 306" is provided with a processing gas introduction means (not shown) for introducing a prescribed processing gas thereinto; a power application electrode 306"-2 which is connected to a high frequency power source 306"-3 is provided in the inner space of the vacuum-processing chamber 306"; at a back side portion of the circumferential wall of the vacuum-processing chamber 306" which is opposed to the web substrate 301, there are provided a wall heater 306"-1 for heating the circumferential wall to a prescribed temperature and a thermocouple (not shown) for controlling the temperature of the circumferential wall; and at a position to oppose the wall heater 306"-1 provided at the circumferential wall of the vacuum-processing chamber 306", there is provided a cooling plate 306"-4 which is connected a fluctuation mechanism member 306"-5 which is provided over an exterior of the vacuum chamber 306, and a cylinder 306"-6 is connected to the fluctuation mechanism member 306"-5.

The first vacuum-processing chamber 306' serves to conduct a first H₂ plasma treatment for the surface of the previously formed i-type semiconductor layer on the web substrate 301 which is maintained at a desired temperature by introducing a processing gas (comprising H₂ gas) into the vacuum-processing chamber 306' through the processing gas introduction means (not shown) and introducing a high frequency power from the high frequency power source 306'-3 into the vacuum-processing chamber 306' to cause plasma discharge to thereby generate a hydrogen plasma, whereby the surface of the i-type semiconductor layer on the web substrate is treated by the hydrogen plasma.

The second vacuum-processing chamber 306" in the vacuum vessel 306 serves to conduct a further H₂ plasma treatment for the plasma-treated surface of the i-type semiconductor layer on the web substrate 301 which is maintained at a desired temperature by introducing a processing gas (comprising H₂ gas) into the vacuum-processing chamber 306" through the processing gas introduction means (not shown) and introducing a high frequency power from the high frequency power source 306"-3 into the vacuum-processing chamber 306" to cause plasma discharge to thereby generate a hydrogen plasma, whereby the plasma-treated surface of the i-type semiconductor layer on the web substrate is again treated by the hydrogen plasma.

In the vacuum vessel 307, there is provided a vacuum-processing chamber 307' such that the open face thereof is opposed to the regular heating means 307-3, where the vacuum-processing chamber 307' is provided with a processing gas introduction means (not shown) for introducing a prescribed processing gas thereinto; a power application electrode 307'-2 which is connected to high frequency power source 307'-3 is provided in the inner space of the vacuum-processing chamber 307'; at a back side portion of the circumferential wall of the vacuum-processing chamber 307' which is opposed to the web substrate 301, there are provided a wall heater 307'-1 for heating the circumferential wall to a prescribed temperature and a thermocouple (not shown) for controlling the temperature of the circumferential wall; and at a position to oppose the wall heater 307'-1 provided at the circumferential wall of the vacuum-processing chamber 307', there is provided a cooling plate 307'-4 which is connected a fluctuation mechanism member 307'-5 which is provided over an exterior of the vacuum chamber 307, and a cylinder 307'-6 is connected to the fluctuation mechanism member 307'-5.

The vacuum-processing chamber 307' in the vacuum vessel 307 serves to form a p-type semiconductor layer on the plasma-treated i-type semiconductor layer on the web substrate 301 which is maintained at a desired temperature by introducing a processing gas (comprising a prescribed raw material gas) into the vacuum-processing chamber 307' through the processing gas introduction means (not shown) and introducing a high frequency power from the high frequency power source 307'-3 into the vacuum-processing chamber 307' to cause plasma discharge and decompose the raw material gas whereby forming a functional deposited film as said p-type semiconductor layer on the plasma-treated i-type semiconductor layer on the web substrate 301.

As above described, in the vacuum-processing apparatus shown in FIG. 2 in this example, it is possible to continuously form a p-i-n junction type photoelectric conversion element by sequentially forming an n-type semiconductor layer, an i-type semiconductor layer, and a p-type semiconductor layer on the surface of a web substrate 301 which is continuously transported from the substrate delivery vacuum vessel 302 to the substrate take-up vacuum vessel 303.

Figure 3:
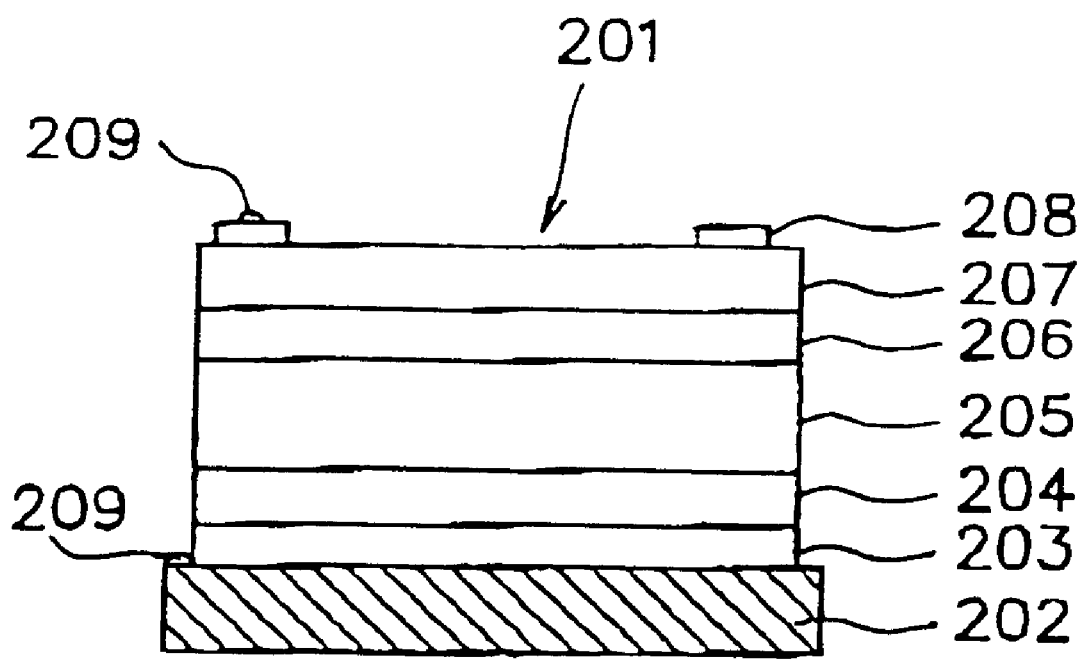
FIG. 3 is a schematic cross-sectional view illustrating an example of a solar cell produced using the vacuum-processing apparatus shown in FIG. 2.

FIG. 3 is a schematic cross-sectional view illustrating a typical solar cell 201 having such a photoelectric conversion element which can be formed by the vacuum-processing apparatus shown in FIG. 2 in this example.

The solar cell 201 shown in FIG. 3 has a layer constitution comprising a lower electrode layer 203, a photoelectric conversion semiconductor layer (comprising an n-type semiconductor layer 204, an i-type semiconductor layer 205, and a p-type semiconductor layer 206 stacked in this order), and an upper electrode layer 207 (or a transparent electrode layer) stacked in this order on a electrically conductive substrate 202. Reference numeral 208 indicates a collecting electrode (a grid electrode) which is formed on the upper electrode layer 207 in order to decrease the sheet resistivity of the upper electrode layer. The collecting electrode 208 is not always necessary to be provided.

The solar cell shown in FIG. 3 is provide with a pair of power output electrodes 209, one being electrically connected to the upper electrode layer 207 and the other being electrically connected to the electrically conductive substrate.

In the case of the solar cell shown in FIG. 3, light is impinged from the side of the upper electrode layer 207. Thus, at least the upper electrode layer 207 is necessary to be constituted by a transparent electrically conductive material. Therefore, the upper electrode layer can be expressed by the term transparent electrode.

Incidentally, it is possible for the solar cell 201 to be designed such that light is impinged from the side of the substrate 202.

In the following, description will be made of each constituent of the solar cell shown in FIG. 3.

As the substrate 202, those substrates mentioned in Example 1 may be selectively used.

The n-type semiconductor layer 204 may be constituted by any of the n-type semiconductor materials mentioned in Example 1. The i-type semiconductor layer 205 may be constituted by any of the i-type semiconductor materials mentioned in Example 1. The p-type semiconductor layer 206 may be constituted by any of the p-type semiconductor materials mentioned in Example 1.

The lower electrode layer 203 comprises a metallic layer constituted by an appropriate metallic material such as a metal or alloy. Specific examples of said metal are Ag, Au, Pt, Ni, Cr, Al, Ti, Zn, Mo, and W Specific examples of said alloy are alloys of said metals such as stainless steels.

The lower electrode layer 203 comprising any of the above-mentioned materials may be formed by means of vacuum deposition, electron beam evaporation, sputtering, or the like. For the metallic layer formed as the lower electrode layer, consideration is necessary to be made so that it does not become to be a resistance component against an output power of the solar cell 201. In view of this, the metallic layer as the lower electrode layer 203 is desired to have a sheet resistance of preferably less than 50 Ω, more preferably less than 10 Ω.

Although this is not shown in FIG. 3, between the lower electrode layer 203 and the n-type semiconductor layer 204, it is possible to provide a buffer layer comprising, for instance, ZnO or the like, in order to prevent occurrence of short circuit or to buffer the metallic material constituting the lower electrode layer. Particularly, in the case where the buffer layer is provide in this way, the metal element(s) constituting the lower electrode layer can be prevented from being dispersed into the n-type semiconductor layer. In addition, by making the buffer layer have a somewhat electric resistance, it is possible to prevent short circuit from being occurred between the lower electrode 203 and the upper electrode layer 207 (the transparent electrode layer) which are provided through the photoelectric conversion semiconductor layer (204, 205, 206) due to defects such as pinhole and the like which are present in the semiconductor layer, and it is also possible to confine incident light which causes multiple interference due to thin films within the solar cell 201.

The buffer layer may be constituted by a material selected from a group consisting of magnesium fluoride series materials or from a group consisting of oxides, nitrides, and carbides of metals such as In, Sn, Cd, Zn, Sb, Si, Cr, Ag, Cu, and Al, and mixtures of these. Particularly, of these materials mentioned here, magnesium fluoride and zinc oxide are most appropriate because these compounds can be readily prepared and they have an adaquate electric resistance and light transmittance which are suitable for the buffer layer.

The upper electrode layer 207 (the transparent electrode layer) is provided on the light incident side of the solar cell 201. The transparent electrode layer 207 is required to have a sufficient transmittance for light having a wavelength which is capable of being absorbed by the semiconductor layer involved and a sufficiently low electric resistance. For the transmittance, it is preferably 70% or more or more preferably, 80% or more, for light from the sun, a white fluorescent lamp or the like.

The transparent electrode layer 207 may comprise a transparent electrically conductive material selected from a group consisting of inorganic oxides such as $SnO_2$, $In_2O_3$, ITO ($In_2O_3+SnO_2$), ZnO, CdO, $Cd_2SnO_4$, and mixture of these. Alternatively, the transparent electrode layer 207 may comprise an extremely thin translucent metallic film formed of an metal such as Au, Al, or Cu.

The transparent electrode layer 207 constituted by any of the above-mentioned materials may be formed by means of resistance-heating evaporation, sputtering, or coating.

The collecting electrode 208 is not always necessary to be provided. The collecting electrode 208 is disposed on a part of the surface of the upper electrode layer 207 (the transparent electrode layer) mainly for the purpose of decreasing the sheet resistance of the upper electrode layer 207.

In the production of a solar cell having such configuration shown in FIG. 3, the upper electrode layer 207 is formed after the formation of the photoelectric conversion semiconductor layer, and because of this, it is difficult to excessively heighten the substrate temperature upon the formation of the upper electrode layer 207. In this connection, the upper electrode layer 207 formed unavoidably becomes to have a relatively high sheet resistance. Therefore, it is preferred to provide the collecting electrode 208.

The collecting electrode 208 may comprise a metal selected from a group consisting of Ag, Cu, Ni, Al, Au, Ti, Pt, C, Mo, and W; an alloy selected from a group consisting of alloys of these metals; or an electrically conductive paste comprising a metallic powder of any of these metals and alloys or a carbon powder.

In the case of using said metal or alloy, a desired pattern as the collecting electrode may be formed by means of vacuum evaporation, sputtering or plating using a patterning mask.

And in the case of using said electrically conductive paste, a desired pattern as the collecting electrode may be formed by means of screen printing using a patterning mask.

The collecting electrode 208 is desired to be formed in a form which is uniformly spread over the entire light receiving face of the solar cell 201 so as to secure a sufficient quantity for light to be impinged into the photoelectric conversion semiconductor layer.

The proportion of the area occupied by the collecting electrode to the entire light-receiving surface area of the solar cell is desired to be preferably less than 15%, more preferably less than 10%.

And for the sheet resistance of the collecting electrode, it is preferably less than 50 Ω, more preferably less than 10 Ω.

Solar Cell Preparation Example in Example 2

In the following, an example in that a solar call having such configuration as shown in FIG. 3 is prepared using the vacuum-processing apparatus shown in FIG. 2 will be described.

Description will be made of the steps adopted in the formation of said solar cell on a web substrate with reference to FIG. 2 and FIG. 3.

1. As the web substrate 301, there was provided a substrate roll comprising a well-cleaned web substrate made of stainless steel SUS430BA having a thickness of 0.2 mm, a width of 300 mm and a length of 900 m and having a lower electrode (203) comprising a 100 nm thick Al film as a back reflecting layer and a 1 μm thick zinc oxide (ZnO) film as a reflection-enhancing layer formed in this order formed by means of a conventional roll-to-roll type film-forming apparatus by means of sputtering (not shown), which is wound on a pay-out bobbin (308) in a roll form.

2. The pay-out bobbin 308 having the web substrate 301 having the lower electrode layer (203) thereon was arranged in the substrate delivery vacuum vessel 302 of the apparatus shown in FIG. 2. From the pay-out bobbin 308, the web substrate 301 was paid out and delivered from the substrate delivery vacuum vessel 302, followed by passing through the gas gate 315, the n-type semiconductor layer-forming vacuum vessel 304, the gas gate 315, the i-type semiconductor layer-forming vacuum vessel 305, the gas gate 315, the $H_2$-plasma treating vacuum vessel 306, the gas gate 315, the p-type semiconductor layer-forming vacuum vessel 307, and the gas gate 315 to enter in the substrate take-up vacuum vessel 303 where the beginning portion of the web substrate 301 was fixed to and wound on the substrate take-up bobbin 309. And the transportation system of the web substrate was adjusted so that the web substrate could be continuously and smoothly transported from the substrate delivery vacuum vessel 302 to the substrate take-up vacuum vessel 303 without being distorted or warped.

3. Then, each of the substrate delivery vacuum vessel 302, the n-type semiconductor layer-forming vacuum vessel 304, the i-type semiconductor layer-forming vacuum vessel 305, the $H_2$-plasma treating vacuum vessel 306, the p-type semiconductor layer-forming vacuum vessel 307, and the substrate take-up vacuum vessel 303 was evacuated until the inner pressure of each vacuum vessel reached about $1 \times 10^{-3}$ Torr ($1.33 \times 10^{-3}$ hPa) through the corresponding exhaust pipe provided with the throttle valve by actuating the vacuum pump (not shown).

4. While continuing this evacuation, $H_2$ gas as a gate gas was flown into each of the gas gates 315 through the corresponding gate gas introduction pipe 316 at a flow rate of 500 atm.cm$^3$/minute. At the same time, He gas was introduced into each of the n-type semiconductor layer-forming vacuum vessel 304, the i-type semiconductor layer-forming vacuum vessel 305, the $H_2$-plasma treating vacuum vessel 306, and the p-type semiconductor layer-forming vacuum vessel 307 at a flow rate of 500 atm.cm$^3$/minute through the corresponding processing gas introduction means (not shown), and by measuring the inner pressure of each of the vacuum vessels 504–507 by the pressure gage (not shown) and adjusting the opening extent of the throttle valve provided at the exhaust pipe based on the reading on the pressure gage, the inner pressure of each of the vacuum vessels 304–307 was maintained at 1.0 Torr (1.33 hPa). Then, the preheating means 304-2, 305-2, 306-2, and 307-2 in the vacuum vessels 304–307 were actuated and simultaneously with this, the wall heater of each of the vacuum-processing chambers 304', 305', 305", 306', 306", and 307' such that the temperature of the web substrate 301 and the temperature of the circumferential wall of each of the vacuum-processing chambers 304', 305', 305", 306', 306", and 307' became 400° C., where this heating was continued for 4 hours, whereby the inside of each of the vacuum vessels 304–307 was subjected to baking treatment to release and remove impurity gas components present therein.

5. Each of the substrate delivery vacuum vessel 302, the n-type semiconductor layer-forming vacuum vessel 304, the i-type semiconductor layer-forming vacuum vessel 305, the $H_2$-plasma treating vacuum vessel 306, the p-type semiconductor layer-forming vacuum vessel 307, and the substrate take-up vacuum vessel 303 was evacuated until the inner pressure of each vacuum vessel reached about $1 \times 10^{-4}$ Torr ($1.33 \times 10^{-4}$ hPa) through the corresponding exhaust pipe provided with the throttle valve by actuating the vacuum pump (not shown).

6. While continuing this evacuation, $H_2$ gas was flown into each of the gas gates 315 through the corresponding gate gas introduction pipe 316 at a flow rate of 1000 atm.cm$^3$/minute.

7. Preparation step for the formation of n-type semiconductor layer (204):

In the n-type layer-forming vacuum vessel 304, the temperature control mechanism (not shown) for the preheating means 304-2 was regulated so that a temperature value indicated by the thermocouple 304-2" under the preheating means 304-2 became 250° C., and under this condition, the web substrate 301 was heated by the preheating means 304-2. And the temperature control mechanism (not shown) for the regular heating means 304-3 was regulated so that a temperature value indicated by the thermocouple 304-3" under the regular heating means 304-3 became 250° C., and under this condition, the web substrate 301 was heated by the regular heating means 304-3. After this, $SiH_4$ gas, $PR_3/H_2$ gas ($PH_3$ gas diluted to 1% by $H_2$ gas), and $H_2$ gas were introduced into the vacuum-processing chamber 304' through the processing gas introduction means (not shown) at respective flow rates of 100 atm.cm$^3$/minute, 500 atm.cm$^3$/minute, and 700 atm.cm$^3$/minute. Then, the inner pressure (the gas pressure) of the vacuum-processing chamber 304' was controlled to 1.0 Torr (1.33 hPa) by means of the vacuum pump (not shown) and through the exhaust pipe 304-1 while regulating the opening extent of the throttle valve 304-1' provided at the exhaust pipe 304-1. Thereafter, the high frequency power source 304'-3 was switched on to supply a high frequency power (with a frequency of 13.56 MHz) of 100 W into the vacuum processing chamber 304' through the power application electrode 304'-2 to generate plasma discharge in the vacuum processing chamber 304'. At this time, constant-temperature water of 20° C. as a cooling medium was flown in the cooling plate 304'-4. And by actuating the fluctuation mechanism member 304'-5 while detecting the position of the cooling plate 304'-4 by a position-detecting sensor (not shown), the cooling plate was moved and fixed at a position where the distance (the interval) between the cooling plate 304'-4 and the circumferential wall of the vacuum processing chamber 304' became 15 cm.

8. Preparation step for the formation of i-type semiconductor layer (205):

In the i-type layer-forming vacuum vessel 305, preparation for the formation of an i-type semiconductor layer in each of the vacuum-processing chamber 305' and the vacuum-processing chamber 305" was conducted as follows:

(1) The temperature control mechanism (not shown) for the preheating means 305-2 was regulated so that a temperature value indicated by the thermocouple 305-2" under the preheating means 305-2 became 300° C., and under this condition, the web substrate 301 was heated by the preheating means 304-2. And the temperature control mechanism (not shown) for the regular heating means 305-3 for the vacuum-processing chamber 305' was regulated so that a temperature value indicated by the thermocouple 305-3" under the regular heating means 305-3 became 300° C., and the web substrate 301 was heated by the regular heating means 305-3. Similarly, the temperature control mechanism (not shown) for the regular heating means 305-4 for the vacuum-processing chamber 305" was regulated so that a temperature value indicated by the thermocouple 305-4" under the regular heating means 305-4 became 300° C., and the web substrate 301 was heated by the regular heating means 305-4.

(2) After this, $SiH_4$ gas, $GeH_4$ gas, and $H_2$ gas were introduced into each of the vacuum-processing chamber 305' and the vacuum-processing chamber 305" through the corresponding processing gas introduction means (not shown) at respective flow rates of 800 atm.cm$^3$/minute, 800 atm.cm$^3$/minute, and 4000 atm.cm$^3$/minute.

Then, the inner pressure (the gas pressure) of each of the vacuum-processing chamber 305' and the vacuum-processing chamber 305" was controlled to 1.0 Torr (1.33 hPa) by means of the vacuum pump (not shown) and through the exhaust pipe 305-1 while regulating the opening extent of the throttle valve 305-1' provided at the exhaust pipe 305-1.

(3) Thereafter, the high frequency power source 305'-3 was switched on to supply a high frequency power (with a frequency of 13.56 MHz) of 1500 W into the vacuum processing chamber 305' through the power application electrode 305'-2 to generate plasma discharge in the vacuum processing chamber 305'. Similarly, the high frequency power source 305"-3 was switched on to supply a high frequency power (with a frequency of 13.56 MHz) of 1500 W into the vacuum processing chamber 305" through the power application electrode 305"-2 to generate plasma discharge in the vacuum processing chamber 305".

At this time, constant-temperature water of 20° C. as a cooling medium was flown in the cooling plate 305'-4 for the vacuum-processing chamber 305'. And by actuating the fluctuation mechanism member 305'-5 while detecting the position of the cooling plate 305'-4 by a position-detecting sensor (not shown), the cooling plate 305'-4 was moved and fixed at a position where the distance (the interval) between the cooling plate 305'-4 and the circumferential wall of the vacuum processing chamber 305' became 10 cm. Similarly, constant-temperature water of 20° C. as a cooling medium was flown in the cooling plate 305"-4 for the vacuum-processing chamber 305". And by actuating the fluctuation mechanism member 305"-5 while detecting the position of the cooling plate 305"-4 by a position-detecting sensor (not shown), the cooling plate 305"-4 was moved and fixed at a position where the distance (the interval) between the cooling plate 305"-4 and the circumferential wall of the vacuum processing chamber 305" became 10 cm.

9. Preparation step for H$_2$-plasma treatment;

In the H$_2$-plasma treating vacuum vessel 306, preparation for the H$_2$-plasma treatment in each of the vacuum-processing chamber 306' and the vacuum-processing chamber 306" was conducted as follows:

(1) The temperature control mechanism (not shown) for the preheating means 306-2 was regulated so that a temperature value indicated by the thermocouple 306-2" under the preheating means 306-2 became 220° C., and under this condition, the web substrate 301 was heated by the preheating means 306-2. And the temperature control mechanism (not shown) for the regular heating means 306-3 for the vacuum-processing chamber 306' was is regulated so that a temperature value indicated by the thermocouple 306-3" under the regular heating means 305-3 became 220° C., and the web substrate 301 was heated by the regular heating means 306-3. Similarly, the temperature control mechanism (not shown) for the regular heating means 306-4 for the vacuum-processing chamber 306" was regulated so that a temperature value indicated by the thermocouple 306-4" under the regular heating means 306-4 became 220° C., and the web substrate 301 was heated by the regular heating means 306-4.

(2) After this, H$_2$ gas was introduced into each of the vacuum-processing chamber 306' and the vacuum-processing chamber 306" through the corresponding processing gas introduction means (not shown) at a flow rates of 1500 atm.cm$^3$/minute. Then, the inner pressure (the gas pressure) of each of the vacuum-processing chamber 306' and the vacuum-processing chamber 306" was controlled to 5.0 Torr (6.67 hPa) by means of the vacuum pump (not shown) and through the exhaust pipe 306-1 while regulating the opening extent of the throttle valve 306-1' provided at the exhaust pipe 306-1.

(3) Thereafter, the high frequency power source 306'-3 was switched on to supply a high frequency power (with a frequency of 13.56 MHz) of 3000 W into the vacuum processing chamber 306' through the power application electrode 306'-2 to generate plasma discharge in the vacuum processing chamber 306'. Similarly, the high frequency power source 306"-3 was switched on to supply a high frequency power (with a frequency of 13.56 MHz) of 3000 W into the vacuum processing chamber 306" through the power application electrode 306"-2 to generate plasma discharge in the vacuum processing chamber 306".

At this time, constant-temperature water of 20° C. as a cooling medium was flown in the cooling plate 306'-4 for the vacuum-processing chamber 306'. And by actuating the fluctuation mechanism member 306'-5 while detecting the position of the cooling plate 306'-4 by a position-detecting sensor (not shown), the cooling plate 306'-4 was moved and fixed at a position where the distance (the interval) between the cooling plate 306'-4 and the circumferential wall of the vacuum processing chamber 306' became 20 cm. Similarly, constant-temperature water of 20° C. as a cooling medium was flown in the cooling plate 306"-4 for the vacuum-processing chamber 306". And by actuating the fluctuation mechanism member 306"-5 while detecting the position of the cooling plate 306"-4 by a position-detecting sensor (not shown), the cooling plate 306"-4 was moved and fixed at a position where the distance (the interval) between the cooling plate 306"-4 and the circumferential wall of the vacuum processing chamber 306" became 20 cm.

10. Preparation step for the formation of p-type semiconductor layer (206):

In the p-type layer-forming vacuum vessel 307, the temperature control mechanism (not shown) for the preheating means 307-2 was regulated so that a temperature value indicated by the thermocouple 307-2" under the preheating means 307-2 became 270° C., and under this condition, the web substrate 301 was heated by the preheating means 307-2. And the temperature control mechanism (not shown) for the regular heating means 307-3 was regulated so that a temperature value indicated by the thermocouple 307-3" under the regular heating means 307-3 became 270° C., and under this condition, the web substrate 301 was heated by the regular heating means 304-3. After this, SiH$_4$ gas, BF$_3$/H$_2$ gas (PH$_3$ gas diluted to 1% by H$_2$ gas), and H$_2$ gas were introduced into the vacuum-processing chamber 307' through the processing gas introduction means (not shown) at respective flow rates of 10 atm.cm$^3$/minute, 500 atm.cm$^3$/minute, and 1000 atm.cm$^3$/minute. Then, the inner pressure (the gas pressure) of the vacuum-processing chamber 307' was controlled to 1.0 Torr (1.33 hPa) by means of the vacuum pump (not shown) and through the exhaust pipe 307-1 while regulating the opening extent of the throttle valve 307-1' provided at the exhaust pipe 307-1. Thereafter, the high frequency power source 307'-3 was switched on to supply a high frequency power (with a frequency of 13.56 MHz) of 3000 W into the vacuum processing chamber 307' through the power application electrode 307'-2 to generate plasma discharge in the vacuum processing chamber 307'. At this time, constant-temperature water of 20° C. as a cooling medium was flown in the cooling plate 307'-4. And by actuating the fluctuation mechanism member 307'-5 while detecting the position of the cooling plate 307'-4 by a position-detecting sensor (not shown), the cooling plate was moved and fixed at a position where the distance (the interval) between the cooling plate 307'-4 and the circumferential wall of the vacuum processing chamber 307' became 15 cm.

11. the web substrate 301 was stated moving at a transportation speed of 2000 mm/minute from the substrate delivery vacuum vessel 302 toward the substrate take-up vacuum vessel 303 while forming an n-type semiconductor layer (204) comprising an n-type semiconductor deposited film on the web substrate 301 in the vacuum chamber 304, forming an i-type semiconductor layer (205) comprising two i-type semiconductor deposited films stacked on said n-type semiconductor layer in the vacuum chamber 305, performing $H_2$-plasma treatment for the surf ace of said i-type semiconductor layer in the vacuum vessel 306, and forming a p-type semiconductor layer (206) on said i-type semiconductor layer in the vacuum chamber 307, and the web substrate 301 (the length: 900 m) having a photoelectric conversion semiconductor layer having a p-i-n junction comprising said n-type semiconductor layer (204), said i-type semiconductor layer (205) and said p-type semiconductor layer (206) sequentially stacked thereon was entirely taken up on and wound on the substrate take-up bobbin 309 in the substrate take-up vacuum vessel 303 in a roll form.

12. After this, all the power sources were switched off all the heating means were switched off, the introduction of all the processing gases was terminated, and the operation of the transportation system of the web substrate was terminated. Then, the respective processing gas lines were purged by He gas. After this, leaking gas comprising $N_2$ gas was introduced into the vacuum vessels 302–507 through gas introduction means (not shown) so that the inner pressure of each of the vacuum vessels became 10 Torr (13.3 hPa), followed by sufficiently cooling the entire inside of the apparatus. Thereafter, the entire inside of the apparatus was returned to atmospheric pressure, and the take-up bobbin 309 having the web substrate 301 with the photoelectric conversion semiconductor layer wound thereon in a roll form (this will be hereinafter referred to as "web substrate roll") was taken out from the substrate take-up vacuum vessel 302.

13. The web substrate roll obtained in the above was set in a conventional roll-to-roll type vacuum evaporation apparatus(not shown), where a 100 nm thick ITO ($In_2O_3$+ $SnO_2$) film as a transparent electrode layer (207) was continuously formed on the p-type semiconductor layer (206) on the web substrate 301.

14. Then, while delivering the web substrate 301 from the resultant roll, the web substrate was cut at every 100 m interval in the transportation direction by means of a cutting machine (not shown) to obtain 8 rectangular photoelectric conversion elements each having a width of 300 mm (30 cm) and a length of 1 m.

Then, a beginning portion of each of the resultant 8 photoelectric conversion elements was cut at an equal interval of 5 cm in the width direction and in the longitudinal direction to obtain 20 element samples having a size of 5 cm×5 cm.

Thus, there were obtained 8 sample groups each comprising 20 element samples.

For each of the resultant element samples, on the transparent electrode layer thereof, there was formed a collecting electrode comprising Al by means of conventional vacuum evaporation using a patterning mask, followed by fixing a pair of power output electrodes (209) respectively to the substrate and the collecting electrode.

Thus, there were obtained 20 solar cell samples (having such configuration as shown in FIG. 3) for each of the foregoing 8 element sample groups, that is, 8 solar cell sample groups each comprising 20 solar cell samples (the 8 solar cell sample groups will be hereinafter referred to as Sample Ex. 2-1 to Sample Ex. 2-8).

The solar cell-preparing conditions adopted in this example are collectively shown in Table 1. Particularly, in this example, as shown in Table 1, depending on the processing conditions in each vacuum-processing chamber, the optimum position of the cooling plate which is capable of stabilizing the wall temperature of the vacuum-processing chamber was determined.

Comparative Example 1

Comparative example of Example 2

The solar cell-preparing procedures of Example 2 were repeated, except that the vacuum-processing apparatus used in Example 2 was replaced by a vacuum-processing apparatus comprising a modification of the vacuum-processing apparatus shown in FIG. 2 in that all the cooling systems including the cooling plates in said vacuum-processing apparatus are omitted, to obtain 8 solar cell sample groups each comprising 20 solar cell samples (the 8 solar cell sample groups will be hereinafter referred to as Sample Comp. 1-1 to Sample Comp. 1-8).

Evaluation

1. For each of the solar cell samples (Samples Ex. 2-1 to Ex. 2-8) obtained in Example 2 and the solar cell samples (Samples Comp. 1-1 to Comp. 1-8) obtained in Comparative Example 1, evaluation was conducted with respect to its photoelectric conversion efficiency ($\eta$) [=a maximum power generated per a unit area (mW/cm$^2$)/intensity of incident light per a unit area (mW/cm$^2$)].

Particularly, for each solar cell sample, evaluation was conducted by a method in that the solar cell sample is placed in an atmosphere with irradiation of pseudo sunlight of AM 1.5 (energy density: 100 mW/cm$^2$) and a prescribed direct current voltage is applied to the solar cell sample through the pair of power output electrodes (209), where measurement of its I-V characteristics was conducted, and based on the resultant I-V characteristics, there are obtained an open-circuit voltage (Voc), a fill factor (F.F.) and a photoelectric conversion efficiency ($\eta$).

And there obtained an average open-circuit voltage (Voc), an average fill factor (F.F.) and an average photoelectric conversion efficiency ($\eta$) for each of Samples Ex. 2-1 to Ex. 2-8 and also for each of Samples Comp. 1-1 to Comp. 1-8.

As a result, there were obtained the following facts.

For Sample Ex. 2-1 and Sample Comp. 1-1 which are of the initial film-forming stage, it was found that the former is surpassing the latter such that the average open-circuit voltage (Voc) of the former is 1.14 times that of the latter, the average fill factor (F.F.) of the former is 1.1 times that of the latter, and the average photoelectric conversion efficiency ($\eta$) of the former is 1.27 times that of the latter.

For Sample Ex. 2-8 and Sample Comp. 1-8 which are of the later film-forming stage, it was found that the solar cell characteristics of the former are substantially the same as those of Sample Ex. 2-1 which is of the initial film-forming stage, but the latter substantially does not exhibit solar cell characteristics as expected.

2. 10 of the 20 solar cell samples of Sample Ex. 2-8 were randomly selected. Each of the 10 solar cell samples selected was vacuum-sealed using a protective film comprising VDF (polyvinylidene fluoride) into a solar cell module sample. Thus, there was obtained a module sample group comprising 10 solar cell module samples (this module sample group will be hereinafter referred to as Module Sample Ex. 2-8). Similarly, 10 of the 20 solar cell samples of Sample Comp. 1 were randomly selected. Each of the 10 solar cell samples selected was vacuum-sealed into a solar cell module sample. Thus, there was obtained a module sample group comprising 10 solar cell module samples (this module sample group will be hereinafter referred to as Module Sample Comp. 1-1).

Each of the solar cell module samples of Module Sample Ex. 2-8 and Module Sample Comp. 1-1 was evaluated in the following manner.

The solar cell module sample is installed outdoors and a fixed resistance is connected to each of the power output electrodes thereof, where an initial photoelectric conversion efficiency ($\eta$) is evaluated; and the solar cell module sample is maintained in this state for one year and after this, a photoelectric conversion efficiency ($\eta$) is evaluated, where a degradation rate between the initial photoelectric conversion efficiency and the photoelectric conversion efficiency after the endurance. And there is obtained an average degradation rate for each of Module Sample Ex. 8 and Module Sample Comp. 1.

As a result, in comparison of the average degradation rate of Module Sample Ex. 2-5 with that of Module Sample Comp. 1-1, the former was found to be smaller than the latter by more than 20%.

From the above results, it is understood that the solar cells obtained in Example 2 stably exhibits a markedly improved photoelectric conversion efficiency even after having been exposed to severe environments in outdoors and which is thus highly reliable.

And it is also understood that the vacuum-processing apparatus in Example 2 enables one to continuously form a highly reliable photoelectric conversion element having uniform characteristics and which has a few defect on an elongated substrate (a web substrate) which is continuously moved, and this situation enables one to mass-produce a number of highly reliable solar cells having a markedly improved photoelectric conversion efficiency.

EXAMPLE 3

The solar cell-preparing procedures of Example 1 were repeated, except that the position of the cooling plate (306'-4, 306"-4) in the $H_2$-plasma treating vacuum vessel 306 was changed with time elapse of the $H_2$-plasma treatment by the vacuum-processing chamber (306', 306") as will be described below, to obtain 8 solar cell sample groups each comprising 20 solar cell samples (the 8 solar cell sample groups will be hereinafter referred to as Sample Ex. 3-1 to Sample Ex. 3-8).

In this example, the cooling plate (306'-4, 306"-4) in the $H_2$-plasma treating vacuum vessel 306 was made to come closer to the circumferential wall of vacuum-processing chamber (306', 306") with time elapse of the $H_2$-plasma treatment by the vacuum-processing chamber (306', 306") so that the temperature of the circumferential wall of vacuum-processing chamber (306', 306") became constant. Specifically, by actuating the fluctuation mechanism member (306'-5, 306"-5), the interval (the distance) between the cooling plate (306'-4, 306"-4) and the circumferential wall of vacuum-processing chamber (306', 306") was changed such that it was 15 cm at the beginning stage of the $H_2$-plasma treatment and was 8 cm at the last stage of the $H_2$-plasma treatment. At this time, using a thermocouple (not shown in the figure) provided at the circumferential wall of the vacuum-processing chamber (306', 306"), the temperature of said circumferential wall during the $H_2$-plasma treatment was measured. As a result, it was found that the temperature of the circumferential wall of the vacuum-processing chamber (306', 306") was maintained to be constant at 120° C. from the beginning stage to the last stage of the $H_2$-plasma treatment.

The solar cell-preparing conditions adopted in this example are collectively shown in Table 2.

Evaluation

1. For each of the solar cell samples (Samples Ex. 3-1 to Ex. 3-8) obtained in this example (Example 3), evaluation was conducted by a method in that the solar cell sample is placed in an atmosphere with irradiation of pseudo sunlight of AM 1.5 (energy density: 100 mW/cm$^2$) and a prescribed direct current voltage is applied to the solar cell sample through the pair of power output electrodes (209), where measurement of its I-V characteristics was conducted, and based on the resultant I-V characteristics, there are obtained an open-circuit voltage (Voc), a fill factor (F.F) and a photoelectric conversion efficiency ($\eta$). And there obtained an average open-circuit voltage, an average fill factor and an average photoelectric conversion efficiency for each of Samples Ex. 3-1 to Ex. 3-8.

The average open-circuit voltage, average fill factor and average photoelectric conversion efficiency Samples Ex. 3-8 in this example (Example 3) were compared with those of Sample Ex. 2-8 in Example 2.

As a result, Sample Ex. 3-8 was found to be superior to Sample Ex. 2-8 such that the average open-circuit voltage of the former is 1.17 times that of the latter, the average fill factor of the former is 1.1 times that of the latter, and the average photoelectric conversion efficiency of the former is 1.2 times that of the latter.

2. 10 of the 20 solar cell samples of Sample Ex. 3-8 were randomly selected. Each of the 10 solar cell samples was vacuum-sealed using a protective film comprising VDF (polyvinylidene fluoride) into a solar cell module sample.

Thus, there was obtained a module sample group comprising 10 solar cell module samples (this module sample group will be hereinafter referred to as Module Sample Ex. 3-8).

Separately, for the foregoing 10 solar cell samples of Sample Ex. 2-8 which were remained without having been subjected to the preparation of solar cell module in Example 2, each of them was vacuum-sealed using a protective film comprising VDF (polyvinylidene fluoride) into a solar cell module sample.

Thus, there was obtained a module sample group comprising 10 solar cell module samples (this module sample group will be hereinafter referred to as Module Sample Ex. 2-8).

Each of the solar cell module samples of Module Sample Ex. 3-8 and Module Sample Ex. 2-8 was evaluated in the following manner.

The solar cell module sample is installed outdoors and a fixed resistance is connected to each of the power output electrodes thereof, where an initial photoelectric conversion efficiency ($\eta$) is evaluated; and the solar cell module sample is maintained in this state for one year and after this, a photoelectric conversion efficiency ($\eta$) is evaluated, where a degradation rate between the initial photoelectric conversion efficiency and the photoelectric conversion efficiency after the endurance. And there is obtained an average degradation rate for each of Module Sample Ex. 3-8 and Module Sample Ex. 2-8.

In comparison of the average degradation rate of Module Sample Ex. 3-8 with that of Module Sample Ex. 2-8 the former was found to be smaller than the latter by about 30%.

From the above results, it is understood that the solar cells obtained in this example (Example 3) [in which the cooling plate (306'-4, 306"-4) in the $H_2$-plasma treating vacuum vessel 306 was made to come closer to the circumferential wall of vacuum-processing chamber (306', 306") with time elapse of the $H_2$-plasma treatment by the vacuum-processing chamber (306', 306") so that the temperature of the circumferential wall of vacuum-processing chamber (306', 306") became constant] stably exhibits a markedly improved photoelectric conversion efficiency even after having been exposed to severe environments in outdoors and which is thus highly reliable.

In this example, the position of the cooling plate was changed in the $H_2$-plasma treating process as above described. This is not limitative. It is possible that the cooling plate (304'-4, 305'-4, 305"-4, 307'-4) in the semiconductor layer-forming vacuum vessel (304, 305, 307) is made to come closer to the circumferential wall of the vacuum-processing chamber (304', 305', 305", 307') with time elapse of the deposition treatment by the vacuum-processing chamber so that the temperature of the circumferential wall of vacuum-processing chamber becomes constant. By doing in this way, such advantages as above described are also provided.

EXAMPLE 4

The solar cell-preparing procedures of Example 1 were repeated, except that on the lower electrode layer (203) formed on the web substrate, there were sequentially formed a first n-type semiconductor layer, a first i-type semiconductor layer, a first p-type semiconductor layer, a second n-type semiconductor layer, a second i-type semiconductor layer, a second p-type semiconductor layer, a thirst n-type semiconductor layer, a third i-type semiconductor layer, and a third p-type semiconductor layer under conditions shown in Table 3 using a modification of the vacuum-processing apparatus shown in FIG. 2, to obtain a number of solar cells having a triple cell structure comprising a first photoelectric conversion semiconductor layer with a p-i-n junction (as a bottom cell), a second photoelectric conversion semiconductor layer with a p-i-n junction (as a middle cell), and a third photoelectric conversion semiconductor layer with a p-i-n junction (as a top cell) stacked in this order.

Here, a combination of said first n-type semiconductor layer, said first i-type semiconductor layer and said first p-type semiconductor layer stacked in this order corresponds said first photoelectric conversion semiconductor, a combination of said second n-type semiconductor layer, said second i-type semiconductor layer and said second p-type semiconductor layer stacked in this order corresponds said second photoelectric conversion semiconductor, and a combination of said third n-type semiconductor layer, said third i-type semiconductor layer and said third p-type semiconductor layer stacked in this order corresponds said third photoelectric conversion semiconductor.

The modification of the vacuum-processing apparatus shown in FIG. 2 is that between the p-type semiconductor layer-forming vacuum vessel 307 and the substrate take-up vacuum vessel 303 of the vacuum-processing apparatus shown in FIG 2, a plurality of vacuum vessels for forming said second photoelectric conversion semiconductor and said third photoelectric conversion semiconductor are arranged while being communicated with each other.

Specifically, between the p-type semiconductor layer-forming vacuum vessel 307 and the substrate take-up vacuum vessel 303 of the vacuum-processing apparatus shown in FIG. 2, there are sequentially ranged a second n-type layer-forming vacuum vessel (whose internal structure is the same as that of the vacuum vessel 304), a second i-type layer-forming vacuum vessel (whose internal structure is the same as that of the vacuum vessel 305), a second $H_2$-plasma treating vacuum vessel (whose internal structure is the same as that of the vacuum vessel 306), a second p-type layer-forming vacuum vessel (whose internal structure is the same as that of the vacuum vessel 307), a third n-type layer-forming vacuum vessel (whose internal structure is the same as that of the vacuum vessel 304), a third i-type layer-forming vacuum vessel (whose internal structure is the same as that of the vacuum vessel 305), and a third p-type layer-forming vacuum vessel (whose internal structure is the same as that of the vacuum vessel 307) such that they are communicated with each other through a gas gate (315) provided with a gate gas introduction pipe (316) in the same manner as in the vacuum-processing apparatus shown in FIG. 2. Between the third i-type layer-forming vacuum vessel and the third p-type layer-foaming vacuum vessel, no $H_2$-plasma treating vacuum vessel is provided.

In this example, each n-type semiconductor layer was formed in the same manner adopted for the formation of the n-type semiconductor layer (204) in Example 2.

Each i-type semiconductor layer was formed in the same manner adopted for the formation of the i-type semiconductor layer (205) in Example 2, except that no $GeH_4$ gas was used in the formation of the third i-type semiconductor layer.

Each p-type semiconductor layer was formed in the same manner adopted for the formation of the p-type semiconductor layer (206) in Example 2.

The $H_2$-plasma treatment In the second $H_2$-plasma treating vacuum vessel is conducted in the same manner as in the $H_2$-plasma treating vacuum vessel 306.

The solar cell-preparing conditions adopted in this example are collectively shown in Table 3.

Using some solar cells randomly selected from the solar cells obtained in the above, there were produced a plurality of solar cell modules having a size of 36 cm×22 cm in accordance with a conventional solar cell module-producing method.

Each of the resultant solar cell modules were evaluated with respect to its characteristics by placing in an atmosphere with irradiation of pseudo sunlight of AM 1.5 (energy density: 100 mW/cm$^2$). As a result, any of the solar cell modules was found to have a photoelectric conversion efficiency of more than 11.5%. And a variation among the solar cell modules with respect to their characteristics was found to be within a range of less than 3%.

Separately, two of the solar cell modules were randomly selected, and each of the two solar cell modules selected was repeatedly subjected to bending test continuously 200 times. After this, each of them was examined. As a result, it was found that the characteristics of each of them are not substantially deteriorated and each of them has substantially no phenomena of layer peeling or the like at the semiconductor layer.

Each of the two solar cell modules having been subjected to the bending test was subjected to continuous irradiation of pseudo sunlight of AM 1.5 (energy density: 100 mW/cm$^2$) for 500 hours, and thereafter, the solar cell module was evaluated with respect to its photoelectric conversion efficiency. As a result, a degradation rate between the initial photoelectric conversion efficiency and the photoelectric conversion efficiency after the endurance was found to be within a range of less than 8.5% in each of the solar cell modules.

And using these solar cell modules, a power supply system having an output power of 3 kW could be established.

Example 5 and Comparative Example 2

EXAMPLE 5

In Example 2, after the web substrate 301 (the length: 900 m) the photoelectric conversion semiconductor layer hating a p-i-n junction (specifically, a n-i-p junction) formed thereon was entirely taken up on and wound on the substrate take-up bobbin 309 in the substrate take-up vacuum vessel 303 in a roll form, the respective processing gas lines were purged by He gas, and leaking gas comprising $N_2$ gas was introduced into the vacuum vessels 302–507 through gas introduction means (not shown) so that the inner pressure of each of the vacuum vessels 302–307 became 10 Torr (13.3 hPa), followed by sufficiently cooling the entire inside of the apparatus. Thereafter, the entire inside of the apparatus was returned to atmospheric pressure, and the take-up bobbin 309 having the web substrate 301 with the photoelectric conversion semiconductor layer wound thereon in a roll form (the web substrate roll) was taken out from the substrate take-up vacuum vessel 302.

This example is intended to more promptly lower the temperature of the vacuum-processing chamber (304', 305', 305", 306', 306", 307') in order to perform maintenance work for the apparatus after the entire inside of the apparatus is returned to atmospheric pressure.

In this respect, in this example, after the process of forming the photoelectric conversion semiconductor layer on the web substrate having a length of 900 m was continuously conducted for 10 web substrates having a length of 900 m (which are respectively the same as the web substrate 301 used in Example 2) in the same manner as in Example 2, $N_2$ gas was introduced into the vacuum vessels 302–507 through gas so that the inner pressure of each of the vacuum vessels 302–307 became 10 Torr (13.3 hPa). Thereafter, in the vacuum vessel 305 (the i-type semiconductor layer-forming vacuum vessel), while detecting the position of the cooling plate (305'-4, 305"-4) by the position-detecting sensor, the cooling plate was contacted to the circumferential wall of the vacuum-processing chamber (305', 305"), where the circumferential wall of the vacuum-processing chamber was cooled until a temperature value indicated by a temperature indicator connected to a thermocouple (not shown) connected to the circumferential wall of the vacuum-processing chamber became less than 80° C.

During this cooling process, a temperature value indicated by said temperature indicator was recorded at every fixed time to examine changes in the temperature of the circumferential wall of the vacuum-processing chamber (305', 305") with time elapse.

The examines results are graphically shown in FIG. 4.

Comparative Example 2

In Comparative Example 1, as well as in Example 5, after the process of forming the photoelectric conversion semiconductor layer on the web substrate having a length of 900 m was continuously conducted for 10 web substrates having a length of 900 m (which are respectively the same as the web substrate 301 used in Example 2) in the same manner as in Example 2, $N_2$ gas was introduced into the vacuum vessels 302–507 through gas so that the inner pressure of each of the vacuum vessels 302–307 became 10 Torr (13.3 hPa). Thereafter, in the vacuum vessel 305 (the i-type semiconductor layer-forming vacuum vessel), the circumferential wall of the vacuum-processing chamber (305', 305") was cooled until a temperature value indicated by a temperature indicator connected to a thermocouple (not shown) connected to the circumferential wall of the vacuum-processing chamber became less than 80° C. by a conventional cooling method.

During this cooling process, a temperature value indicated by said temperature indicator was recorded at every fixed time to examine changes in the temperature of the circumferential wall of the vacuum-processing chamber (305', 305") with time elapse.

The examines results are graphically shown in FIG. 4.

As the results shown in FIG. 4 illustrate, it is understood that in the vacuum-processing apparatus of the present invention, the time required for cooling the apparatus can be markedly shortened. Therefore, in the vacuum-processing apparatus of the present invention, it is possible that the time required for performing maintenance work for the apparatus is greatly shortened and the apparatus is operated at a markedly improved operating efficiency.

As above described, it is understood that the present invention provided such pronounced advantages as will be described below.

By providing a cooling plate capable of being moved at a position opposed to a face of the circumferential wall of a vacuum-processing chamber provided in a vacuum vessel, it is possible that heat exchange takes place between the cooling plate and the circumferential wall of the vacuum-processing chamber to restrain a temperature rise with time elapse which is occurred at the circumferential wall of the vacuum-processing chamber due to influence of a plasma or the like when a substrate is vacuum-processed in the vacuum-processing chamber. Further, in this case, by changing the interval (the distance) between the cooling plate and the circumferential wall of the vacuum-processing chamber to change a heat exchange magnitude between them, it is possible to maintain the temperature of the circumferential wall of the vacuum-processing chamber at a temperature which is suitable for vacuum-processing a substrate in the vacuum-processing chamber.

Therefore, it is possible to continuously conduct a desired vacuum-processing treatment for a given substrate under constant condition over a long period of time at a good repeatability.

Particularly, it possible to continuously form a semiconductor device (a photoelectric conversion element) having uniform and stable characteristics and a desired photoelectric conversion efficiency on an elongated substrate having a large area over a long period of time. This situation makes it possible to mass-produce a highly reliable solar cell at a good yield.

Further, according to the present invention, by contacting the cooling plate to the circumferential wall of the vacuum-processing chamber to enhance the heat exchange magnitude between them, it is possible that the vacuum-processing chamber whose circumferential wall having been made to have a high temperature is cooled within a short period of time. This situation makes it possible to shorten the time required for maintenance work for the apparatus, to increase the operating efficiency of the apparatus, and to reduce the production cost of the apparatus.

TABLE 1

| | |
|---|---|
| substrate | SUS 430BA; width: 300 mm; thickness: 0.2 mm |
| back reflecting layer | Al; thickness: 100 nm |
| reflection-enhancing layer | zinc oxide (ZnO); thickness: 1 μm |
| gate gas | $H_2$ gas for each gas gate; flow rate: 1000 atm.cc/min. |

| name or treatment | gas used & its flow rate (cc/min.) | | discharging power (W) | inner pressure (Torr) | substrate temperature (° C.) | amount of cooling water (L/min.) | position of the cooling plate (cm) |
|---|---|---|---|---|---|---|---|
| formation of n-type layer | $SiH_4$ | 100 | 100 | 1.0 | 250 | 5 | 15 |
| | $PH_3/H_2$ (diluted to 1%) | 500 | | | | | |
| | $H_2$ | 700 | | | | | |
| formation of i-type layer | $SiH_4$ | 800 | 1500 | 3.0 | 300 | 10 | 10 |
| | $GeH_4$ | 800 | 1500 | | | | |
| | $H_2$ | 4000 | | | | | |
| $H_2$ plasma treatment | $H_2$ | 1500 | 3000 | 5.0 | 220 | 20 | 20 |
| formation of p-type layer | $SiH_4$ | 10 | 3000 | 1.0 | 270 | 15 | 15 |
| | $BF_2/H_2$ (diluted to 1%) | 500 | | | | | |
| | $H_2$ | 6000 | | | | | |
| transparent electrode layer | ITO($In_2O_3 + SnO_2$); thickness: 100 nm | | | | | | |
| collecting electrode | Al; thickness: 2 μm | | | | | | |

TABLE 2

| | |
|---|---|
| substrate | SUS 430BA; width: 300 mm; thickness: 0.2 mm |
| back reflecting layer | Al; thickness: 100 nm |
| reflection-enhancing layer | zinc oxide (ZnO); thickness: 1 μm |
| gate gas | $H_2$ gas for each gas gate; flow rate: 1000 atm.cc/min. |

| name or treatment | gas used & its flow rate (cc/min.) | | discharging power (W) | inner pressure (Torr) | substrate temperature (° C.) | amount of cooling water (L/min.) | position of the cooling plate (cm) |
|---|---|---|---|---|---|---|---|
| formation of n-type layer | $SiH_4$ | 100 | 100 | 1.0 | 250 | 5 | 15 |
| | $PH_3/H_2$ (diluted to 1%) | 500 | | | | | |
| | $H_2$ | 700 | | | | | |
| formation of i-type layer | $SiH_4$ | 800 | 1500 | 3.0 | 300 | 10 | 10 |
| | $GeH_4$ | 800 | 1500 | | | | |
| | $H_2$ | 4000 | | | | | |
| $H_2$ plasma treatment | $H_2$ | 1000 | 5000 | 2.0 | 220 | 20 | changed |
| formation of p-type layer | $SiH_4$ | 10 | 3000 | 1.0 | 270 | 15 | 15 |
| | $BF_2/H_2$ (diluted to 1%) | 500 | | | | | |
| | $H_2$ | 6000 | | | | | |
| transparent electrode layer | ITO($In_2O_3 + SnO_2$); thickness: 100 nm | | | | | | |
| collecting electrode | Al; thickness: 2 μm | | | | | | |

TABLE 3

| | |
|---|---|
| substrate | SUS 430BA; width: 300 mm; thickness: 0.2 mm |
| back reflecting layer | Al; thickness: 100 nm |
| reflection-enhancing layer | zinc oxide (ZnO); thickness: 1 μm |
| gate gas | $H_2$ gas for each gas gate; flow rate: 1000 cc/min. |

| name or treatment | gas used & its flow rate (cc/min.) | | discharging power (W) | inner pressure (Torr) | substrate temperature (° C.) | amount of cooling water (L/min.) | position of the cooling plate (cm) |
|---|---|---|---|---|---|---|---|
| formation of 1st n-type layer | $SiH_4$ | 100 | 100 | 1.0 | 250 | 5 | 15 |
| | $PH_3/H_2$ (diluted to 1%) | 500 | | | | | |
| | $H_2$ | 700 | | | | | |
| formation of 1st i-type layer | $SiH_4$ | 800 | 1500 | 3.0 | 300 | 10 | 10 |
| | $GeH_4$ | 900 | 1500 | | | | |
| | $H_2$ | 3000 | | | | | |
| 1st $H_2$ plasma treatment | $H_2$ | 1000 | 5000 | 2.0 | 220 | 20 | changed |
| formation of 1st p-type layer | $SiH_4$ | 10 | 3000 | 1.0 | 270 | 15 | 15 |
| | $BF_2/H_2$ (diluted to 1%) | 500 | | | | | |
| | $H_2$ | 6000 | | | | | |
| formation of 2nd n-type layer | $SiH_4$ | 50 | 50 | 1.0 | 250 | 5 | 15 |
| | $PH_3/H_2$ (diluted to 1%) | 250 | | | | | |
| | $H_2$ | 700 | | | | | |

TABLE 3-continued

| | | | | | | | |
|---|---|---|---|---|---|---|---|
| substrate | SUS 430BA; width: 300 mm; thickness: 0.2 mm | | | | | | |
| back reflecting layer | Al; thickness: 100 nm | | | | | | |
| reflection-enhancing layer | zinc oxide (ZnO); thickness: 1 μm | | | | | | |
| gate gas | $H_2$ gas for each gas gate; flow rate: 1000 cc/min. | | | | | | |
| name or treatment | gas used & its flow rate (cc/min.) | | discharging power (W) | inner pressure (Torr) | substrate temperature (° C.) | amount of cooling water (L/min.) | position of the cooling plate (cm) |
| formation of $2^{nd}$ i-type layer | $SiH_4$ | 80 | 1500 | 3.0 | 300 | 10 | 10 |
| | $GeH_4$ | 80 | 1500 | | | | |
| | $H_2$ | 200 | | | | | |
| $2^{nd}$ $H_2$ plasma treatment | $H_2$ | 1000 | 5000 | 2.0 | 220 | 20 | changed |
| formation of $2^{nd}$ p-type layer | $SiH_4$ | 10 | 3000 | 1.0 | 270 | 15 | 15 |
| | $BF_2/H_2$ (diluted to 1%) | 500 | | | | | |
| | $H_2$ | 6000 | | | | | |
| formation of $3^{rd}$ n-type layer | $SiH_4$ | 50 | 50 | 1.0 | 250 | 5 | 15 |
| | $PH_3/H_2$ (diluted to 1%) | 250 | | | | | |
| | $H_2$ | 700 | | | | | |
| formation of $3^{rd}$ i-type layer | $SiH_4$ | 800 | 1500 | 3.0 | 300 | 10 | 10 |
| | $H_2$ | 3000 | 1500 | | | | |
| formation of $3^{rd}$ p-type layer | $SiH_4$ | 3 | 3000 | 1.0 | 270 | 15 | 15 |
| | $BF_2/H_2$ (diluted to 1%) | 500 | | | | | |
| | $H_2$ | 6000 | | | | | |
| transparent electrode layer | $ITO(In_2O_3 + SnO_2)$; thickness: 100 nm | | | | | | |
| collecting electrode | Al; thickness: 2 μm | | | | | | |

What is claimed is:

1. A vacuum-processing apparatus comprising a vacuum vessel whose inside being capable of being evacuated, a processing chamber arranged in said vacuum vessel and a heater for heating a circumferential wall of said processing chamber, wherein a substrate is arranged in said processing chamber and said substrate is vacuum-processed in said processing chamber while maintaining said substrate at a prescribed temperature and introducing a processing gas therein under reduced pressure, characterized in that said vacuum-processing apparatus has a cooling plate outside said processing chamber arranged at a position to oppose said circumferential wall of said processing chamber and a mechanism for moving said cooling plate so as to change a distance between said cooling plate and said circumferential wall of said processing chamber.

2. The vacuum-processing apparatus according to claim 1, wherein a fluctuation mechanism member capable of retaining said cooling plate is provided over an exterior of said vacuum vessel such that said fluctuation mechanism member is connected to said cooling plate, and a driving mechanism which is connected to said fluctuation mechanism member is arranged at a position outside said vacuum vessel.

3. The vacuum-processing apparatus according to claim 1, wherein said fluctuation mechanism member has a connection member for retaining said cooling plate such that said connection member is extended from said fluctuation mechanism member into said vacuum vessel to connect to said cooling plate through an end portion of said connection member and the other end portion of said connection member is situated in said fluctuation mechanism member, and said fluctuation mechanism member has a vacuum sealing portion which is provided to hermetically enclose said other end portion of said connection member situated in said fluctuation mechanism member in order to maintain said vacuum vessel in an airtight state.

4. The vacuum-processing apparatus according to claim 3, wherein said vacuum sealing portion comprises a flexible vacuum sealing member.

5. The vacuum-processing apparatus according to claim 1 which further comprises a position-confirming means for confirming a position of said cooling plate in said vacuum vessel.

6. The vacuum-processing apparatus according to claim 5, wherein said position-confirming means includes a position-detecting sensor for detecting said position of said cooling plate.

7. The vacuum-processing apparatus according to claim 1, wherein said processing for said substrate includes deposition of a film on said substrate by means of plasma CVD using a processing gas.

8. The vacuum-processing apparatus according to claim 1, wherein a transportation means for transporting an elongated substrate as said substrate is provided, said processing chamber comprises a plurality of vacuum-processing chambers arranged along a transportation passage of said elongated substrate, and said vacuum vessel includes one or more of said plurality of vacuum-processing chambers.

9. The vacuum-processing apparatus according to claim 8 which is used for subjecting said elongated substrate to a surface treatment to form a photoelectric conversion element comprising a plurality of semiconductor layers including one or more amorphous semiconductor layers stacked on said elongated substrate.

* * * * *

UNITED STATES PATENT AND TRADEMARK OFFICE
CERTIFICATE OF CORRECTION

PATENT NO. : 6,547,922 B2
DATED : April 15, 2003
INVENTOR(S) : Tadashi Hori et al.

It is certified that error appears in the above-identified patent and that said Letters Patent is hereby corrected as shown below:

Column 2,
Line 46, "an semiconductor" should read -- a semiconductor --.

Column 3,
Line 25, "work this" should read -- work.  This --;
Lines 26 and 28, "period" should read -- period of --;
Line 36, "order" should read -- order to --;
Line 38, "a" should read -- an --.

Column 4,
Line 1, "period" should read -- period of --;
Line 13, "An principal" should read -- A principal --;
Line 54, "chamber" should read -- chamber. --.

Column 5,
Line 7, "is occurred" should read -- occurs --;
Line 23, "example" should read -- examples --.

Column 6,
Line 29, "doing in" should read -- doing it in --.

Column 7,
Line 46, "shown)" should read -- shown). --;
Line 64, "a" should read -- an --.

Column 9,
Line 19, "The" should read -- the --;

Column 10,
Line 9, "lose," should read -- loss, --;
Line 17, "conducted" should read -- be conducted --;
Line 59, "wade" should read -- made --.

Column 11,
Line 31, "Irregular" should read -- irregular --;
Line 42, "layer The" should read -- layer.  The --;
Line 48, "a-SiGe:H." should read -- a-SiGe:H, --.

UNITED STATES PATENT AND TRADEMARK OFFICE
CERTIFICATE OF CORRECTION

PATENT NO.    : 6,547,922 B2
DATED         : April 15, 2003
INVENTOR(S)   : Tadashi Hori et al.

It is certified that error appears in the above-identified patent and that said Letters Patent is hereby corrected as shown below:

Column 12,
Line 3, "Ga." should read -- Ga, --;
Line 33, "SiF$_3$H$_2$," should read -- SiF$_2$H$_2$, --;
Line 45, "CnH$_2$n," should read -- CnH$_2$n --.

Column 15,
Line 27, "space" should read -- surface --;
Lines 62 and 64, "provide" should read -- provided --.

Column 16,
Lines 4, 6, 7, 17, 18, 20, 28 and 30, "provide" should read -- provided --;
Line 47, "substrate" should read -- substrate, --.

Column 17,
Lines 20 and 56, "a" should read -- to a --.

Column 18,
Line 42, "plasma pro-" should read -- plasma-processing --;
Line 43, "cessing" should be deleted;
Line 51, "fox" should read -- for --.

Column 19,
Lines 17 and 64, "a" should read -- to a --.

Column 20,
Line 33, "a" should read -- an --;
Line 39, "provide" should read -- provided --.

Column 21,
Line 2, "W" should read -- W. --;
Line 19, "provide" should read -- provided --;
Line 53, "mixture" should read -- mixtures --.

Column 22,
Line 5, "becomes to have" should read -- attains --;
Line 35, "call" should read -- cell --.

UNITED STATES PATENT AND TRADEMARK OFFICE
CERTIFICATE OF CORRECTION

PATENT NO.    : 6,547,922 B2
DATED         : April 15, 2003
INVENTOR(S)   : Tadashi Hori et al.

It is certified that error appears in the above-identified patent and that said Letters Patent is hereby corrected as shown below:

Column 25,
Line 42, "was is" should read -- was --.

Column 26,
Line 64, "the" should read -- The --;
Line 65, "stated" should read -- started --.

Column 27,
Line 6, "sur face" should read -- surface --;
Line 17, "off" should read -- off, --.

Column 28,
Line 40, "And there" should read -- And there is --;
Line 53, "later" should read -- latter --.

Column 29,
Line 20, "Ex. 2-5" should read -- Ex. 2-8 --.

Column 30,
Line 66, "Ex. 2-8" should read -- Ex. 2-8, --.

Column 31,
Line 33, "thirst" should read -- third --.

Column 32,
Line 1, "ranged" should read -- arranged --;
Line 19, "layer-foaming" should read -- layer-forming --;
Line 31, "In" should read -- in --.

Column 33,
Line 9, "hating" should read -- having --;
Line 55, "examines" should read -- examined --.

UNITED STATES PATENT AND TRADEMARK OFFICE
CERTIFICATE OF CORRECTION

PATENT NO. : 6,547,922 B2
DATED : April 15, 2003
INVENTOR(S) : Tadashi Hori et al.

It is certified that error appears in the above-identified patent and that said Letters Patent is hereby corrected as shown below:

<u>Column 34,</u>
Line 15, "examines" should read -- examined --;
Line 50, "it" should read -- its is --.

Signed and Sealed this

Twenty-fourth Day of February, 2004

JON W. DUDAS
*Acting Director of the United States Patent and Trademark Office*